(12) United States Patent  
Lee et al.

(10) Patent No.: US 9,118,313 B2  
(45) Date of Patent: Aug. 25, 2015

(54) SEMICONDUCTOR MEMORY DEVICE CALIBRATING TERMINATION RESISTANCE AND TERMINATION RESISTANCE CALIBRATION METHOD THEREOF

(71) Applicant: Samsung Electronics Co., Ltd., Suwon-si (KR)

(72) Inventors: Hoon Lee, Seoul (KR); Jin-Hee Park, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/466,509

(22) Filed: Aug. 22, 2014

(65) Prior Publication Data

US 2015/0117122 A1    Apr. 30, 2015

(30) Foreign Application Priority Data

Oct. 31, 2013    (KR) .................. 10-2013-0131334

(51) Int. Cl.
*G11C 11/00* (2006.01)
*H03K 19/00* (2006.01)
*G11C 7/12* (2006.01)

(52) U.S. Cl.
CPC .............. *H03K 19/0005* (2013.01); *G11C 7/12* (2013.01); *G11C 2207/2254* (2013.01)

(58) Field of Classification Search
CPC .................... G11C 2207/2254; G11C 7/1051; G11C 7/1078; G11C 7/222
USPC ............................................. 365/148, 189.07
See application file for complete search history.

(56) References Cited

U.S. PATENT DOCUMENTS

| | | | |
|---|---|---|---|
| 7,432,731 B2 | 10/2008 | Bains et al. | |
| 7,773,440 B2 | 8/2010 | Kim et al. | |
| 7,821,291 B2 | 10/2010 | Mei | |
| 7,859,296 B2 | 12/2010 | Kim et al. | |
| 8,111,085 B2 | 2/2012 | Ibaraki et al. | |
| 8,278,973 B2 | 10/2012 | Kuwahara et al. | |
| 8,441,282 B2 | 5/2013 | Kim | |
| 2009/0003090 A1* | 1/2009 | Kim et al. | ................ 365/189.11 |
| 2011/0066798 A1 | 3/2011 | Kaiwa et al. | |

(Continued)

FOREIGN PATENT DOCUMENTS

| | | |
|---|---|---|
| KR | 10-2010-0003602 A | 1/2010 |
| KR | 10-2010-0006887 A | 1/2010 |

(Continued)

*Primary Examiner* — Tuan T Nguyen
(74) *Attorney, Agent, or Firm* — Muir Patent Law, PLLC

(57) ABSTRACT

Provided is a semiconductor memory device calibrating a termination resistance, the semiconductor memory device comprising self-adjustment logic configured to determine whether a value of an upper bit string of a calibration code generated in response to a calibration start signal is equal to or greater than an upper critical value of the calibration code, or is equal to or less than a lower critical value of the calibration code, and to generate an adjustment signal for adjusting a value of a termination resistance of a data output driver based on the determination result; and resistance calibration logic configured to provide the upper bit string to the self-adjustment logic, and to generate an updated calibration code by performing a calibration calculation based on the calibration code and a comparison signal generated according to a result of comparing a reference voltage and a voltage of a comparison target node.

20 Claims, 15 Drawing Sheets

(56) References Cited

U.S. PATENT DOCUMENTS

| | | | |
|---|---|---|---|
| 2011/0193590 A1 | 8/2011 | Nakagawa et al. | |
| 2011/0204869 A1 | 8/2011 | Kim | |
| 2011/0267900 A1* | 11/2011 | Kim | 365/189.07 |
| 2012/0013007 A1 | 1/2012 | Hwang et al. | |
| 2014/0016404 A1* | 1/2014 | Kim et al. | 365/158 |

FOREIGN PATENT DOCUMENTS

| | | |
|---|---|---|
| KR | 10-2011-0096845 A | 8/2011 |
| KR | 10-2012-0004145 A | 1/2012 |

\* cited by examiner

SEMICONDUCTOR MEMORY DEVICE CALIBRATING TERMINATION RESISTANCE AND TERMINATION RESISTANCE CALIBRATION METHOD THEREOF

CROSS-REFERENCE TO RELATED APPLICATIONS

This U.S. non-provisional patent application claims priority under 35 U.S.C. §119 to Korean Patent Application No. 10-2013-0131334 filed on Oct. 31, 2013, in the Korean Intellectual Property Office, the entire contents of which are hereby incorporated by reference.

BACKGROUND

The present disclosure described herein relates to a semiconductor memory system, and more particularly, relates to a termination resistance calibration method of a semiconductor memory device including a termination resistance.

A memory system may include a controller and a semiconductor memory device connected to a transmission line. A data signal transmitted along the transmission line may be reflected at an end of the transmission line. The reflected data signal may become noise and may affect an original data signal, thus, quality of the data signal may be lowered. A termination resistance may be connected to the end of the transmission line to prevent the data signal from being reflected. The termination resistance is a component used to reduce reflection of the data signal and to prevent lowering of quality of the data signal, by matching between an internal impedance and an external impedance of a semiconductor memory device. The termination resistance is typically used for a DRAM having a high operation speed. Recently, to prevent signal interference between DRAMs, an ODT (On Die Termination) technique is used for connecting the termination resistance to the interior of the DRAM.

Since the DRAM may have an operation speed higher than 1000 MHz under, for example, DDR3 SDRAM (Double Data Rate 3 Synchronous DRAM) standards, higher quality and stability of the data signal may be required. If impedance is not matched due to a variation in a value of the termination resistance according to a variation in a fabrication process, a power supply voltage, and an operation temperature, it may be difficult to transmit a data signal at high speed, and data is often distorted. The DDR3 SDRAM may use ZQ calibration logic to secure high signal quality and stability. The internal impedance and the external impedance of the semiconductor memory device may be matched by calibrating the termination resistance according to a calibration code generated by the ZQ calibration logic. Examples of ZQ calibration are described in U.S. Pat. No. 7,859,296 to Kim et al., and U.S. Pat. No. 8,111,085 to Ibaraki et al., both of which are incorporated by reference herein in their entirety.

However, time for calibrating the termination resistance is limited. According to typical ZQ calibration logic, calibration intervals for each of pull-up and pull-down resistances are partially overlapped due to time limitation, thus, reliability of calibration may be lowered. If the number of bits of the calibration code is reduced to overcome the time limitation, accuracy of encoding is decreased, thus, a characteristic of a data output driver is negatively influenced. In addition, if a value of the termination resistance is largely changed according to a PVT (Process, Voltage, and Temperature) variation, an accurate impedance matching may be impossible.

According to a typical technique, impedance matching is performed by using fuses to manually adjusting the value of the termination resistance. However, this calibration method may be limited in that calibration time for impedance matching is increased and automatic calibration may be impossible.

SUMMARY

Exemplary embodiments provide a semiconductor memory device. The semiconductor memory device includes a termination resistance calibration circuit configured to calibrate a first termination resistance of a data output driver of the semiconductor memory device. The termination resistance calibration circuit includes: a first self-adjustment logic is configured to determine whether a value of an upper bit string of a first calibration code is equal to or greater than a first upper critical value with respect to the first calibration code, or is equal to or less than a first lower critical value with respect to the first calibration code, in response to a first calibration start signal, and to generate a first adjustment signal for adjusting a value of the first termination resistance of the data output driver based on the determination result of the first self-adjustment logic, wherein the first lower critical value is less than the upper critical value; and a first resistance calibration logic is configured to provide the upper bit string of the first calibration code to the first self-adjustment logic, and to generate a first updated calibration code by performing a first calibration calculation based on the first calibration code and a first comparison signal generated according to a result of comparing a reference voltage and a voltage of a first comparison target node. The first updated calibration code calibrates the first termination resistance of the data output driver after the value of the first termination resistance of the data output driver is adjusted by the first adjustment signal.

In exemplary embodiments, the value of the first termination resistance of the data output driver is adjusted in an increasing direction or in a decreasing direction, and the adjusted direction of the value of the first termination resistance of the data output driver when the value of the upper bit string of the first calibration code is equal to or greater than the first upper critical value is different from that when the value of the upper bit string of the first calibration code is equal to or less than the first lower critical value.

In exemplary embodiments, the first self-adjustment logic further is configured to generate a bit position signal including position information of a bit of the first calibration code based on the determination result of the first self-adjustment logic, and the first calibration calculation is performed based on the first calibration code, the first comparison signal, and the bit position signal.

In exemplary embodiments, the bit position signal comprises position information of one of the bits included in the upper bit string of the first calibration code when the value of the upper bit string of the first calibration code is equal to or greater than the first upper critical value, or is equal to or less than the first lower critical value, and the bit position signal comprises position information of one of the remaining bits of the first calibration code other than the first upper bit string of the first calibration code when the value of the upper bit string of the first calibration code is less than the upper critical value and greater than the first lower critical value.

In exemplary embodiments, the first resistance calibration logic is configured to perform the first calibration calculation by adding a calculation bit string, of which only one bit has a logical value of 1 or 0, to the first calibration code or by subtracting the calculation bit string from the first calibration code, one of the addition and the subtraction is performed based on the first comparison signal, a position of the only one bit, having a logical value of 1 or 0, of the calculation bit string is shifted by one or more bits in lower bit direction from a position of a bit corresponding to the bit position signal, at each time when the addition or the subtraction is performed, and the addition or the subtraction is iteratively performed until a least significant bit of the calculation bit string becomes the only one bit having a logical value of 1 or 0.

In exemplary embodiments, the first updated calibration code corresponds to the first calibration code when performing the addition or the subtraction is ended.

Other exemplary embodiments provide a method for calibrating a termination resistance of a semiconductor memory device. The method includes loading a calibration code in response to a calibration start signal; determining whether a value of an upper bit string of the calibration code is equal to or greater than an upper critical value, or equal to or less than a lower critical value, wherein the lower critical value is less than the upper critical value; adjusting a value of a termination resistance of a data output driver when the value of the upper bit string of the calibration code is equal to or greater than the upper critical value, or equal to or less than the lower critical value; generating an updated calibration code by performing a calibration calculation based on the calibration code and a comparison signal generated according to a result of comparing a reference voltage and a voltage of a comparison target node; and calibrating the termination resistance of the data output driver based on the adjusted value and the updated calibration code.

In exemplary embodiments, the value of the termination resistance of the data output driver is adjusted by an adjustment signal in an increasing direction or in a decreasing direction, and the adjusted direction of the value of the termination resistance of the data output driver when the value of the upper bit string of the calibration code is equal to or greater than the upper critical value is different from that when the value of the upper bit string of the calibration code is equal to or less than the lower critical value.

In exemplary embodiments, the method further comprises generating a bit position signal including position information of one bit of the calibration code when the calibration calculation is started, based on the determination result. The calibration calculation is performed based on the calibration code, the comparison signal, and the bit position signal.

In exemplary embodiments, the bit position signal comprises position information of one of the bits included in the upper bit string of the calibration code when the value of the upper bit string of the calibration code is equal to or greater than the upper critical value, or is equal to or less than the lower critical value, and the bit position signal comprises position information of one of the remaining bits of the calibration code other than the upper bit string of the calibration code when the value of the upper bit string of the calibration code is less than the upper critical value and greater than the lower critical value.

In exemplary embodiments, the calibration calculation is performed by adding a calculation bit string, of which only one bit has a logical value of 1 or 0, to the calibration code or by subtracting the calculation bit string from the calibration code, one of the addition and the subtraction is performed based on the comparison signal, a position of the only one bit, having a logical value of 1 or 0, of the calculation bit string is shifted by one or more bits in lower bit direction from a position of a bit corresponding to the bit position signal, at each time when the addition or the subtraction is performed, and the addition or the subtraction is iteratively performed until a least a significant bit of the calculation bit string becomes the only one bit having a logical value of 1 or 0.

In exemplary embodiments, the updated calibration code corresponds to the calibration code when performing the addition or the subtraction is ended.

Still other embodiments provide a method of calibrating a termination resistance of a data output driver of a semiconductor memory device. The method includes performing a first calibration of a first termination resistance of the semiconductor memory device to generate a first calibration code; performing a first adjustment of the first termination resistance based on the first calibration code in response to a first calibration start signal to generate a first adjustment code for adjusting a value of the first termination resistance; and performing a second calibration of the first termination resistance in response to the first adjustment code to generate a first updated calibration code corresponding to a first target termination resistance. The first adjustment code and the first updated calibration code control either a pull-up driver of the data output driver or a pull-down driver of the data output driver.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
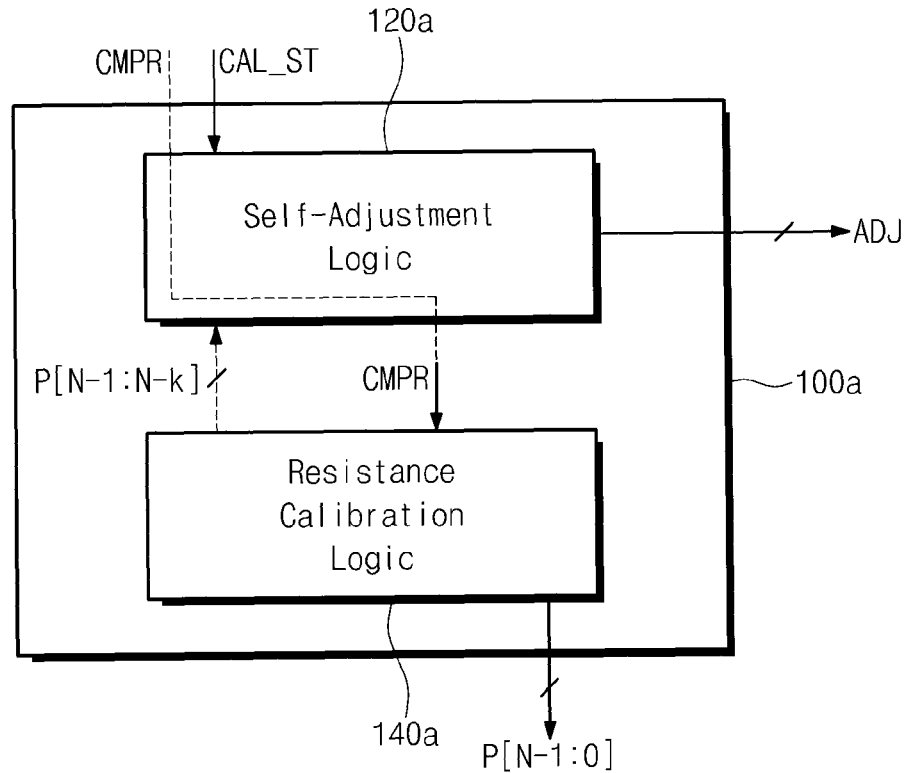
FIG. 1 is a block diagram schematically illustrating a termination resistance calibration circuit according to an exemplary embodiment.

Exemplary embodiments will be described in detail with reference to the accompanying drawings. The disclosure, however, may be embodied in various different forms, and should not be construed as being limited only to the illustrated embodiments. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first" and "second" may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to limit the disclosure. As used herein, the singular forms "a", "an" and "the" are intended to include the plural forms as well, unless the context clearly indicates otherwise. Expressions such as "at least one of," when preceding a list of elements, modify the entire list of elements and do not modify the individual elements of the list.

It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Throughout the specification, it will also be understood that when an element is referred to as being "connected to" another element, it can be directly connected to the other element, or intervening elements may also be present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, it is assumed that a DRAM (Dynamic Random Access Memory) is used as a semiconductor memory device. However, the disclosure is not limited thereto. For example, the disclosure may be applied to other semiconductor memory devices, each device having a high operation speed and including a termination resistance.

FIG. 1 is a block diagram schematically illustrating a termination resistance calibration circuit according to an exemplary embodiment. A termination resistance calibration circuit 100a is a circuit calibrating a termination resistance of a semiconductor memory device. The termination resistance calibration circuit 100a includes a self-adjustment logic 120a and a resistance calibration logic 140a. The termination resistance calibration circuit 100a may be included in a semiconductor memory device.

The self-adjustment logic 120a may receive a calibration start signal CAL_ST. For example, the calibration start signal CAL_ST may be generated by a command decoder (not shown) included in a memory system. The self-adjustment logic 120a and the resistance calibration logic 140a may begin to operate in response to the calibration start signal CAL_ST.

The self-adjustment logic 120a may refer to an upper bit string P[N-1:N-k] (N and k being greater than 1 and natural numbers) corresponding to one or more upper bits of a calibration code formed of a plurality of bits. The calibration code may be a code for calibrating a termination resistance. A process for calibrating the termination resistance by using the calibration code will be more fully described later. The calibration code may be a code formed of N bits. The upper bit string P[N-1:N-k] may be formed of k upper bits extracted from the N bits of the calibration code. For example, data corresponding to the calibration code may be stored in a register (not shown) included in the resistance calibration logic 140a. The resistance calibration logic 140a may provide a signal corresponding to the upper bit string P[N-1:N-k] of the calibration code to the self-adjustment logic 120a.

In one embodiment, it is assumed that the calibration code is a 6-bit code (i.e., N=6) and the upper bit string P[5:3] is formed of 3 upper bits (i.e., k=3) extracted from the calibration code. However, bit numbers of the calibration code and the upper bit string may be variously changed. The above assumption is made for ease of description and understanding of the disclosed embodiments, and is not intended to be limiting of the disclosure.

The self-adjustment logic 120a may determine whether a value of the upper bit string P[5:3] is equal to or greater than an upper critical value, or equal to or less than a lower critical value. The lower critical value may be less than the upper critical value. The upper critical value and the lower critical value may be set to be random as necessary. For example, the upper critical value may be '111', and the lower critical value may be '000'. Accordingly, the self-adjustment logic 120a may determine whether the value of the upper bit string P[5:3] of three bits is equal to or greater than '111', or equal to or less than '000'. However, the upper critical value and the lower critical value are not limited to '111' and '000', respectively. For example, the upper critical value and the lower critical value may be set to, for example, '000' and '111', or '110' and '001', respectively. For example, embodiments of the disclosure may be variously changed or modified by a person skilled in the art.

The self-adjustment logic 120a may generate an adjustment signal (e.g., adjustment code) ADJ based on the determination result. The adjustment signal ADJ may be used to adjust a value of the termination resistance of a data output driver. For example, the adjustment signal ADJ may be generated when the value of the upper bit string P[5:3] of three bits is equal to or greater than the upper critical value of '111', or equal to or less than the lower critical value of '000'. For example, the adjustment signal ADJ may include at least one bit. A function of the adjustment signal ADJ will be more fully described with reference to FIGS. 2 to 8.

The resistance calibration logic 140a may receive a comparison signal CMPR. The comparison signal CMPR may be a signal generated by comparing a reference voltage and a voltage of a comparison target node. For example, the comparison signal CMPR may have a different value according to a magnitude relationship between the reference voltage and the voltage of the comparison target node (e.g., ZQ pin). In exemplary embodiments, the comparison target node may be an output terminal of a pull-up resistance or an input terminal of a pull-down resistance. The comparison signal CMPR may be generated by a comparator (not shown). For example, the comparator may be included in the termination resistance calibration circuit 100a. The comparison signal CMPR may be provided to the resistance calibration logic 140a directly or through the self-adjustment logic 120a.

The resistance calibration logic 140a may perform a calibration calculation based on the provided comparison signal CMPR and the calibration code stored in the register. The calibration calculation may be a calculation of increasing or decreasing a value of the calibration code according to a value of the comparison signal CMPR. The calibration code may be a code for calibrating the termination resistance, i.e., for matching between the termination resistance and an external resistance (not shown). For example, the external resistance may be included in a transmission line or in a channel connected to an external pin of the semiconductor memory device. The external pin may be, for example, a data input/output (DQ) pin, a data strobe (DQS) pin, a data mask (DM) pin, a termination data strobe (TDQS) pin, or the like. If the voltage of the comparison target node is higher than the reference voltage, the resistance calibration logic 140a may increase (or decrease) the value of the calibration code to calibrate the termination resistance. In this case, the voltage of the comparison target node may be decreased. On the other hand, if the voltage of the comparison target node is lower than the reference voltage, the resistance calibration logic 140a may decrease (or increase) the value of the calibration code to calibrate the termination resistance. In this case, the voltage of the comparison target node may be increased.

The resistance calibration logic 140a may increase or decrease the value of the calibration code until the voltage of the comparison target node becomes the same as the reference voltage. The termination resistance and the external resistance may be matched when the voltage of the comparison target node becomes the same as the reference voltage. A calibration code when the termination resistance and the external resistance are matched may be stored in the register of the resistance calibration logic 140a as an updated calibration code such as P[5:0]. The updated calibration code P[5:0] may be outputted from the resistance calibration logic 140a.

In one embodiment, the value of the termination resistance of the data output driver may be first adjusted by the adjustment signal ADJ. Then, the termination resistance having a value adjusted by the adjustment signal ADJ may be calibrated by the updated calibration code P[5:0]. That is, the termination resistance of the data output driver may be matched with the external resistance through a step for adjusting a value by the adjustment signal ADJ and a step for calibrating by the updated calibration code P[5:0].

Figure 2:
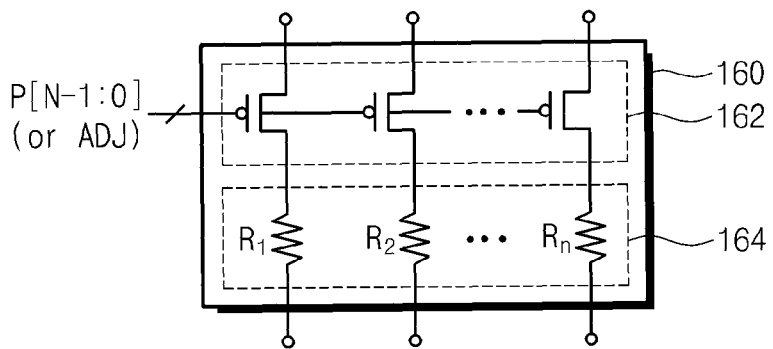
FIG. 2 is an exemplary block diagram for describing a process to change a resistance value of a variable resistance circuit by an adjustment signal and an updated calibration code according to an embodiment.

FIG. 2 is an exemplary block diagram for describing a process to change a resistance value of a variable resistance circuit by an adjustment signal and an updated calibration code according to an embodiment. An equivalent circuit of a variable resistance circuit 160 may be expressed by a plurality of transistors 162 and a plurality of resistances 164 respectively connected to the plurality of transistors 162 in series. For example, each of the plurality of transistors 162 may include a PMOS transistor or an NMOS transistor. In one embodiment, each one end of the plurality of transistors 162 may connect to a power supply voltage (e.g., VDDQ) and each one end of the plurality of resistances 164 may connect to the comparison target node (e.g., ZQ pin). In another embodiment, each one end of the plurality of transistors 162 may connect to a ground voltage and each one end of the plurality of resistances 164 may connect to the comparison target node.

Each of the plurality of transistors 162 may be turned on or off by an updated calibration code P[N-1:0] or an adjustment signal ADJ. The plurality of transistors 162 may be turned on or off by respective bits of the updated calibration code P[N-1:0] or respective bits of the adjustment signal ADJ. In the case that the updated calibration code P[5:0] of six bits is used, the plurality of transistors 162 may include six transistors, which are respectively turned on or off by corresponding bits of the updated calibration code P[5:0]. Like the updated calibration code P[N-1:0] and the adjustment signal ADJ may be used to turn on or off the plurality of transistors 162. Bit numbers of the updated calibration code P[N-1:0] or the adjustment signal ADJ and the number of the plurality of transistors 162 may be changed as necessary. For example, the updated calibration code P[N-1:0] may include 6 bits and the adjustment code ADJ may include 1 or 2 bits.

When each of the plurality of transistors 162 is turned on or off, a current may selectively flow to each of the plurality of resistances 164. Thus, an equivalent resistance value of the variable resistance circuit 160 may be varied. For example, the equivalent resistance value of the variable resistance circuit 160 may be varied by the updated calibration code P[N-1:0] or the adjustment signal ADJ.

FIGS. 3 to 7 are conceptual diagrams for describing a function of an adjustment signal according to exemplary embodiments. As described with reference to FIG. 2, an equivalent resistance value of a variable resistance circuit 160 (refer to FIG. 2) may be changed by an adjustment signal ADJ (refer to FIG. 2). In particular, the adjustment signal ADJ may be a signal for adjusting a value of a termination resistance prior to calibration of the termination resistance.

For better understanding, it may be assumed that a six-bit calibration code is used. The termination resistance may be assumed to have the same structure as the equivalent circuit of the variable resistance circuit 160 shown in FIG. 2. Also, it may be assumed that a maximum value Rmax of the termination resistance is encoded by the calibration code of, for example, '111111' and a minimum value Rmin of the termination resistance is encoded by the calibration code of, for example, '000000'. The above assumptions may be for ease of description and may not limit the disclosure. For example, it may be assumed that a maximum value Rmax of the termination resistance is encoded by the calibration code of, for example, '110011,' and a minimum value Rmin of the termination resistance is encoded by the calibration code of, for example, '001100'. Below, a function of the adjustment signal ADJ will be described.

Figure 3:
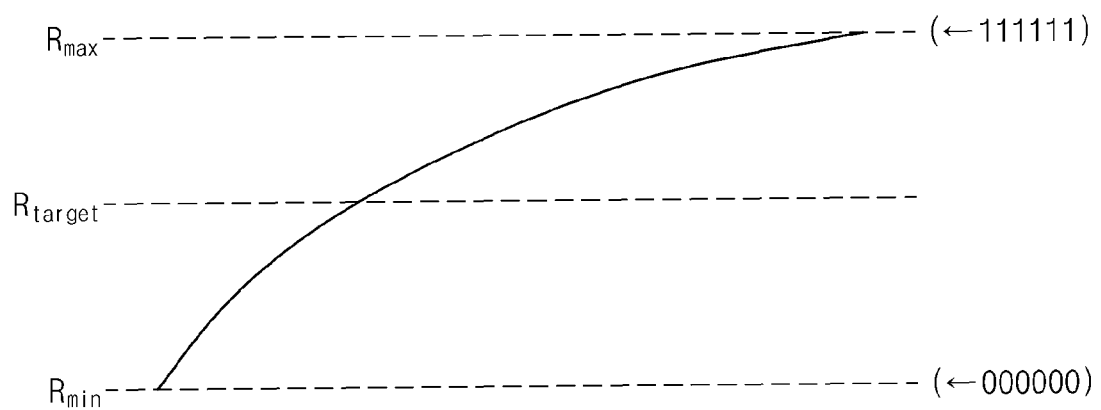
FIGS. 3 to 7 are conceptual diagrams for describing a function of an adjustment signal according to exemplary embodiments.

FIG. 3 shows the case that the termination resistance is at the most ideal state. In FIG. 3, a target value Rtarget may be located between the maximum value Rmax and the minimum value Rmin of a resistance value (e.g., (Rmax+Rmin)/2) that the termination resistance can have. The target value Rtarget of the termination resistance may be a value of the termination resistance corresponding to such a case that the termination resistance and an external resistance are matched. For example, the target value Rtarget of the termination resistance may be encoded by an updated calibration code P[5:0] (refer to FIG. 2). In FIG. 3, the target value Rtarget of the termination resistance may be encoded by increasing or decreasing a value of a calibration code by a calibration calculation.

Figure 4:
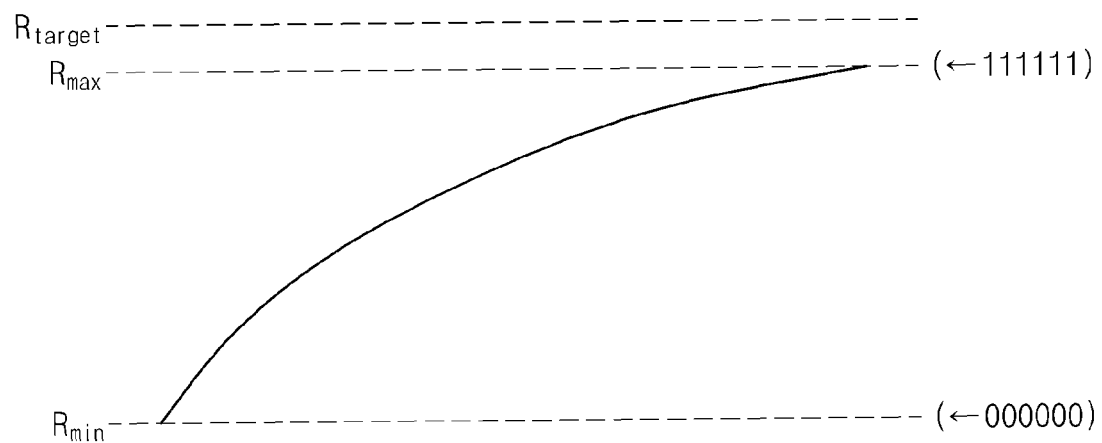
Figure 5:
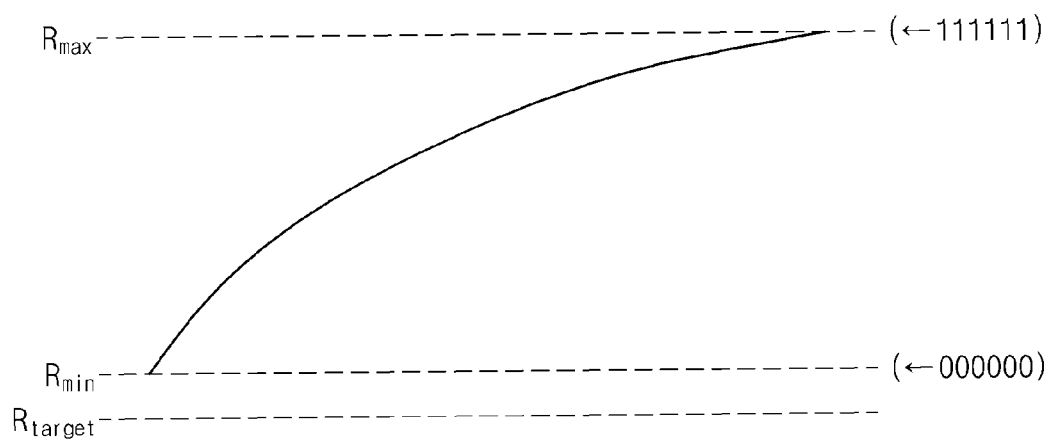
Figure 6:
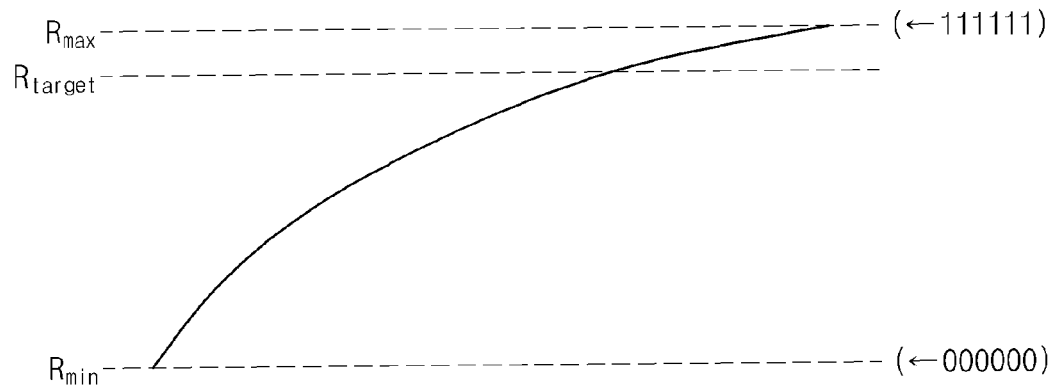
Figure 7:
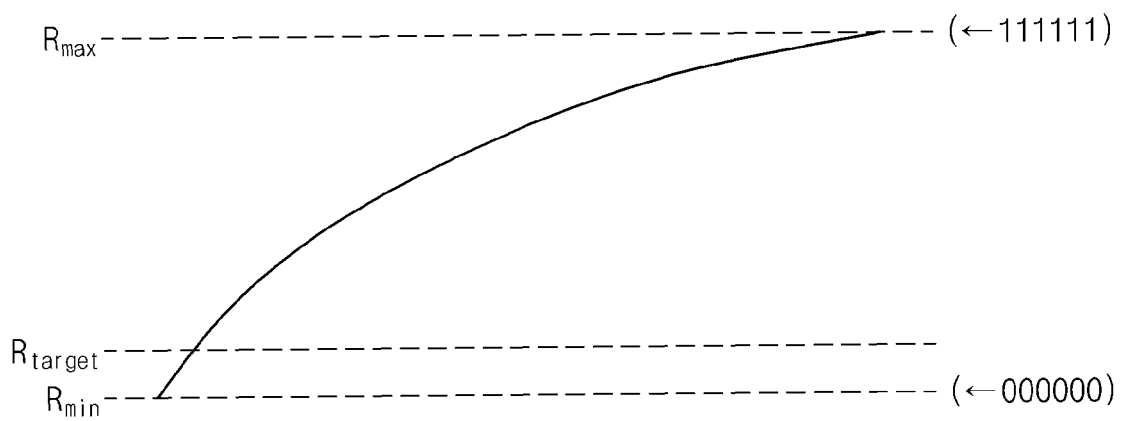

If the value of the termination resistance is largely decreased (refer to FIG. 4) or increased (refer to FIG. 5) by a PVT (Process, Voltage, and Temperature) variation, the target value Rtarget of the termination resistance may not be encoded, even if the calibration code is increased up to '111111' or is decreased up to '000000'. For example, if the target value Rtarget of the termination resistance gets out of a range between the maximum value Rmax and the minimum value Rmin, it may be impossible to match the termination resistance and the external resistance through the calibration calculation. Thus, in the case that the value of the termination resistance is largely decreased as illustrated in FIG. 4, it may be necessary to increase the value of the termination resistance as illustrated in FIG. 6. Also, in the case that the value of the termination resistance is largely increased as illustrated in FIG. 5, it may be necessary to decrease the value of the termination resistance as illustrated in FIG. 7. For example, it may be assumed that if a value of the termination resistance reaches up to '111111' it may be necessary to increase the value of the termination resistance as illustrated in FIG. 6 before performing a calibration calculation. Also, it may be assumed that if a value of the termination resistance reaches up to '000000' it may be necessary to decrease the value of the termination resistance as illustrated in FIG. 7 before performing a calibration calculation.

If the value of the termination resistance is largely decreased as illustrated in FIG. 4 (e.g., reaches up to Rmax), the value of the termination resistance may be increased by an adjustment signal ADJ as illustrated in FIG. 6. Also, if the value of the termination resistance is largely increased as illustrated in FIG. 5 (e.g., reaches up to Rmin), the value of the termination resistance may be decreased by the adjustment signal ADJ as illustrated in FIG. 7. For example, the value of the termination resistance may be adjusted by the adjustment signal ADJ. In this case, the target value Rtarget of the termination resistance may be located between the maximum value Rmax and the minimum value Rmin. Thus, it is possible to generate the calibration code (i.e., an updated calibration code P[5:0]) that encodes the target value Rtarget of the termination resistance by a calibration calculation.

Figure 8:
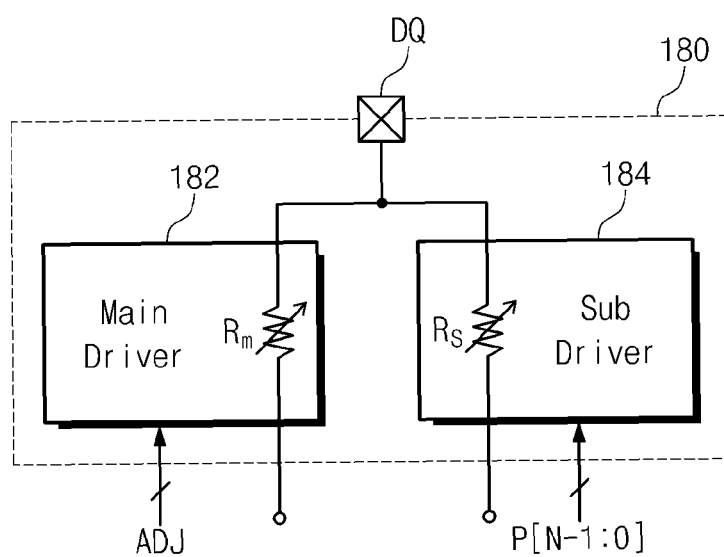
FIG. 8 is a block diagram for describing an operation to change a value of a termination resistance of a data output driver by an adjustment signal and an updated calibration code according to an exemplary embodiment.

FIG. 8 is a block diagram for describing an operation to change a value of a termination resistance of a data output driver by an adjustment signal and an updated calibration code P[N-1:0] according to an exemplary embodiment. In FIG. 8, there is shown a part of a data output driver 180 that outputs data through a DQ pad DQ. The data output driver 180 may include a main driver 182 and a sub driver 184.

The main driver 182 may include a main driver resistance Rm. The sub driver 184 may include a sub driver resistance Rs. A termination resistance of the data output driver 180 may be formed of the main driver resistance Rm and the sub driver resistance Rs. For example, a value of the main driver resistance Rm and a value of the sub driver resistance Rs may decide a value of the termination resistance of the data output driver 180.

The main driver resistance Rm may be controlled by an adjustment signal ADJ generated by a self-adjustment logic 120a (refer to FIG. 1). In exemplary embodiments, a configuration of the main driver 182 may be the same as that of a variable resistance circuit 160 (refer to FIG. 2). For example, transistors included in the main driver 182 may be turned on or off by bits of the adjustment signal ADJ. A current may selectively flow to each of resistances respectively connected to the transistors, based on whether each of the transistors is turned on or off. Thus, the value of the main driver resistance Rm may be changed. For example, the value of the main driver resistance Rm may be varied by the adjustment signal ADJ.

If the value of the termination resistance of the data output driver 180 is largely decreased or increased due to a PVT variation, the termination resistance and the external resistance may not be matched. Thus, the value of the termination resistance need be adjusted when the value of the termination resistance of the data output driver 180 is largely decreased or increased.

The value of the termination resistance of the data output driver 180 may be adjusted by the adjustment signal ADJ in an increasing direction or a decreasing direction. For example, if the value of the termination resistance is largely decreased as illustrated in FIG. 4, the value of the termination resistance may be increased by the adjustment signal ADJ in an increasing direction as illustrated in FIG. 6. Also, if the value of the termination resistance is largely increased as illustrated in FIG. 5, the value of the termination resistance may be decreased by the adjustment signal ADJ in a decreasing direction as illustrated in FIG. 7. In particular, when the value of the main driver resistance Rm is adjusted by the adjustment signal ADJ, the value of the termination resistance may be adjusted. When the value of the termination resistance is adjusted, it may be possible to perform an impedance matching between the termination resistance and an external resistance.

Herein, a reference for deciding direction in which the value of the termination resistance is adjusted by the adjustment signal ADJ will be described. For ease of description, it may be assumed that three upper bits of a six-bit calibration code form an upper bit string P[5:3]. As set forth above, this assumption is not for limiting the spirit and scope of the disclosure. For example, described is the case that an upper critical value is '111' and a lower critical value is '000'. However, the disclosure is not limited thereto. For example, the disclosure may be applied to the case that the upper critical value is '000' and the lower critical value is '111'.

In one embodiment, the case that the upper bit string P[5:3] has a value of '111' may indicate a state where the value of the termination resistance is decreased due to the PVT variation. The reason is why the upper bit string P[5:3] having a value of '111' means that the termination resistance and the external resistance are matched by largely increasing the value of the calibration code. If the case shown in FIG. 4 is occurred due to a further decrease in the value of the termination resistance under the above-described state, the termination resistance and the external resistance may not be matched even if the calibration calculation is performed. In this case, the value of the termination resistance may be adjusted by the adjustment signal ADJ in an increasing direction. When the value of the termination resistance is increased, the termination resistance and the external resistance may be matched.

In one embodiment, even though the upper bit string P[5:3] has '111', it may be assumed the updated calibration code P[N-1:0] has the maximum value Rmax. In this case, the value of the termination resistance may be adjusted by the adjustment signal ADJ in an increasing direction. When the value of the termination resistance is increased, a value of the termination resistance may be between the maximum value Rmax and the minimum value Rmin, and then the termination resistance and the external resistance may match easily by a calibration calculation.

In one embodiment, the case that the upper bit string P[5:3] has a value of '000' may indicate a state where the value of the termination resistance is increased due to the PVT variation. The reason is why the upper bit string P[5:3] having a value of '000' means that the termination resistance and the external resistance are matched by largely decreasing the value of the calibration code. If the case shown in FIG. 5 is occurred due to a further increase in the value of the termination resistance under the above-described state, the termination resistance and the external resistance may not be matched even if the calibration calculation is performed. In this case, the value of the termination resistance may be adjusted by the adjustment signal ADJ in a decreasing direction. When the value of the termination resistance is decreased, the termination resistance and the external resistance may be matched.

In one embodiment, even though the upper bit string P[5:3] has '000', it may be assumed the updated calibration code P[N-1:0] has the minimum value Rmin. In this case, the value of the termination resistance may be adjusted by the adjustment signal ADJ in a decreasing direction. When the value of the termination resistance is decreased, a value of the termination resistance may be between the maximum value Rmax and the minimum value Rmin, and then the termination resistance and the external resistance may match easily by a calibration calculation.

When the upper bit string P[5:3] has '111' which is the upper critical value or '000' which is the lower critical value, the likelihood that the termination resistance and the external resistance are not matched due to the PVT variation is very high. Thus, if it is determined that the upper bit string P[5:3] has '111' which is the upper critical value, the value of the termination resistance need be adjusted, in advance, by the adjustment signal ADJ in an increasing direction. Also, if it is determined that the upper bit string P[5:3] has '000' which is the lower critical value, the value of the termination resistance need be adjusted, in advance, by the adjustment signal ADJ in a decreasing direction.

For example, if a value of an upper bit string P[N-1:N-k] is equal to or greater than the upper critical value, the value of the termination resistance may be adjusted, in advance, by the adjustment signal ADJ in an increasing direction. If the value of the upper bit string P[N-1:N-k] is equal to or less than the lower critical value, the value of the termination resistance may be adjusted, in advance, by the adjustment signal ADJ in a decreasing direction. The self-adjustment logic 120a may generate the adjustment signal ADJ based on the value of the upper bit string P[N-1:N-k], thus, the likelihood that the termination resistance and the external resistance is not matched may be lowered. In exemplary embodiments, the adjustment signal ADJ may not be generated when the upper bit string P[N-1:N-k] is less than the upper critical value and greater than the lower critical value. Alternatively, the adjustment signal ADJ indicating that the value of the termination resistance need not be adjusted may be generated.

Direction in which the value of the termination resistance is adjusted by the adjustment signal ADJ may be changed in such cases that the upper critical value is '000' and the lower critical value is '111', that the calibration code of '000000' encodes the maximum value Rmax of the termination resistance and the calibration code of '111111' encodes the minimum value Rmin of the termination resistance, etc. For instance, if the value of the upper bit string P[5:3] is equal to or greater than the upper critical value, the value of the termination resistance may be adjusted by the adjustment signal ADJ in a decreasing direction. Also, if the value of the upper bit string P[5:3] is equal to or less than the lower critical value, the value of the termination resistance may be adjusted by the adjustment signal ADJ in an increasing direction. For example, adjusted direction of the value of the termination resistance when the value of the upper bit string is equal to or greater than the upper critical value is different from that when the value of the upper bit string is equal to or less than the lower critical value.

An updated calibration code P[N-1:0] may calibrate the termination resistance of the data output driver 180. In particular, the updated calibration code P[N-1:0] may calibrate the termination resistance by changing a value of the sub driver resistance Rs. In exemplary embodiments, a configuration of the sub driver 184 may be the same as that of the variable resistance circuit 160. For example, transistors of the sub driver 184 may be turned on or off by bits of the updated calibration code P[N-1:0]. A current may selectively flow to each of resistances respectively connected to the transistors, based on each of the transistors is turned on or off. Thus, the value of the sub driver resistance Rs may be changed.

The termination resistance and the external resistance may be matched when the termination resistance is calibrated by the updated calibration code P[N-1:0]. In particular, the updated calibration code P[N-1:0] may calibrate the termination resistance of which a value is adjusted by the adjustment signal ADJ. The value of the termination resistance has to be adjusted by the adjustment signal ADJ before the termination resistance is calibrated by the updated calibration code P[N-1:0]. If the value of the termination resistance is not adjusted by the adjustment signal ADJ, it may be possible that the termination resistance and the external resistance are not matched.

Resistance calibration logic 140a (refer to FIG. 1) may generate the updated calibration code P[N-1:0]. In exemplary embodiments, a register (not shown) included in the resistance calibration logic 140a may be an up/down counter. The value of the calibration code stored in the up/down counter may be increased or decreased by 1 according to a result of comparing a reference voltage with a voltage of a comparison target node. The value of the termination resistance may be changed based on the calibration code having an increased or decreased value. After the value of the termination resistance is changed, the reference voltage and the voltage of the comparison target node may be compared again. The value of the calibration code may be increased or decreased again, according to the comparison result.

If the above-described operation is iterated, the voltage of the comparison target node may become the same as the reference voltage. In this case, the termination resistance and the external resistance may be matched. For example, the resistance calibration logic 140a may output the calibration code, as the updated calibration code P[N-1:0], when the voltage of the comparison target node may become the same as the reference voltage.

In one embodiment, the termination resistance may be calibrated even when the value of the termination resistance is varied due to the PVT variation. Also, the value of the termination resistance may be automatically adjusted without manually controlling the value of the termination resistance by using, for example, fuses. Thus, reliability of calibration of the termination resistance may be improved.

The adjustment signal ADJ may adjust the value of the main driver resistance Rm of the data output driver 180 to make a state in which the termination resistance and the external resistance are matched. For example, it may be determined whether the value of the upper bit string P[N-1:N-k] is equal to or greater than the upper critical value, or equal to or less than the lower critical value. The value of the termination resistance may be adjusted by adjusting the value of the main driver resistance Rm. Afterwards, the updated calibration code P[N-1:0] may change the value of the sub driver resistance Rs to calibrate the termination resistance in detail. For example, a calibration calculation may be performed by using an up/down counter that increases or decreases the value of the calibration code by 1. If the termination resistance is calibrated by the updated calibration code P[N-1:0], the termination resistance and the external resistance is matched.

However, when the up/down counter is used, ($2^N$-1) operations may be required in the worst case. For example, when the up/down counter is used, a relatively many number of operations may be required. Thus, time for performing the calibration calculation may be increased, and efficiency of the calibration calculation may be lowered. In one embodiment, for reducing time for performing the calibration calculation, a description with respect to a calibration calculation utilizing a binary search algorithm will be mentioned together with a description on FIG. 9.

Figure 9:
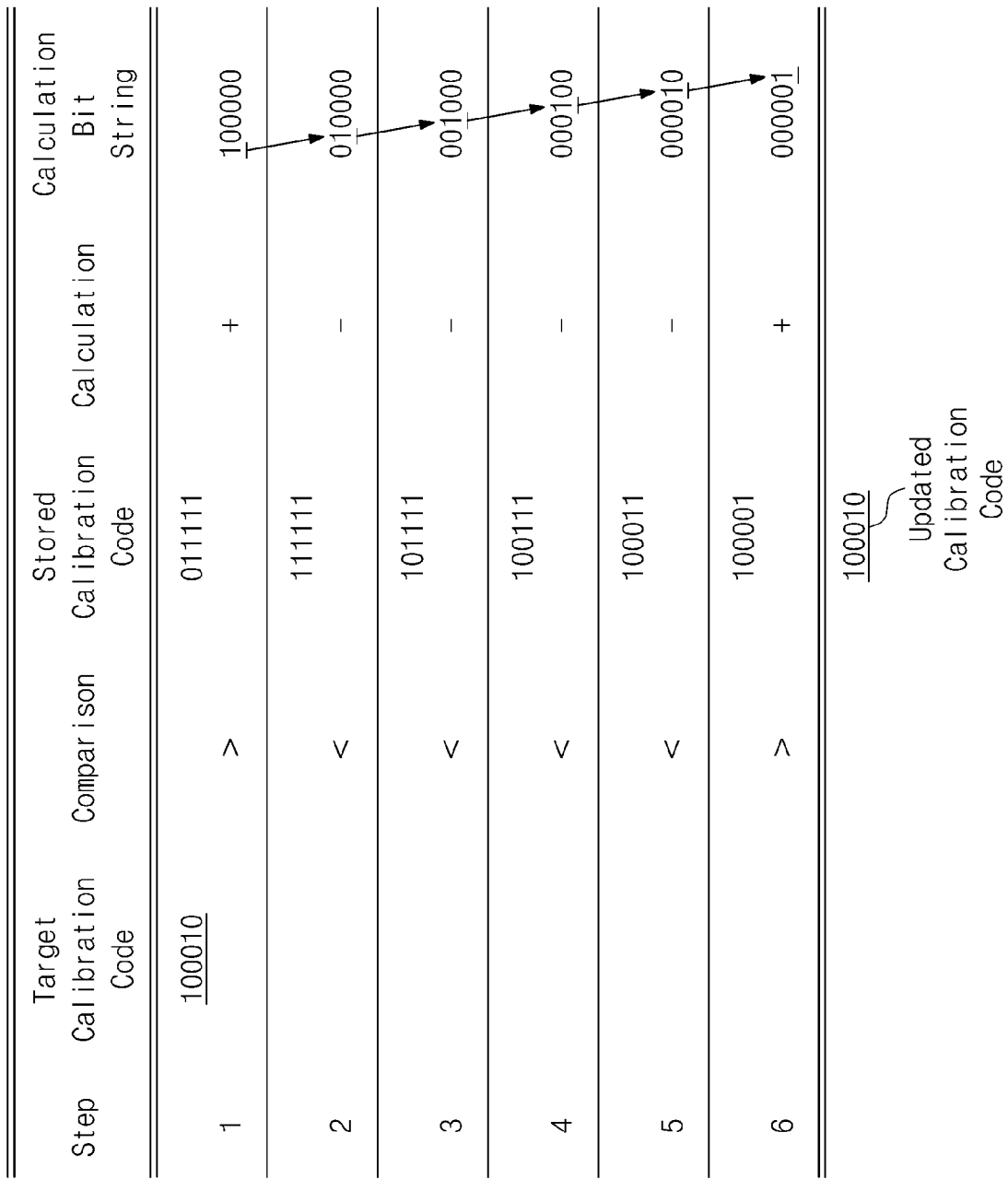
FIG. 9 is a conceptual diagram for describing an exemplary calibration calculation according to an embodiment.

FIG. 9 is a conceptual diagram for describing an exemplary calibration calculation according to an embodiment. Particularly, a calibration calculation to be mentioned together with a description on FIG. 9 may utilize a binary search algorithm.

In one embodiment, a calculation bit string of which only one bit has a logical value of 1 or 0 may be used in the calibration calculation that utilizes the binary search algorithm. The calculation bit string may be added to the calibration code or may be subtracted from the calibration code. For example, the calibration calculation utilizing the binary search algorithm may be performed by addition or subtraction between the calculation bit string and the calibration code. An operation to be performed among addition and subtraction, between the calculation bit string and the calibration code, may be decided according to a comparison signal generated according to a result of comparing a reference voltage with a voltage of a comparison target node.

A position of the only one bit, having a logical value of 1 or 0, of the calculation bit string may be shifted by one or more bits in lower bit direction at each time when the addition or subtraction of the calculation bit string and the calibration code is performed. In exemplary embodiments, as the position of the only one bit, having a logical value of 1 or 0, of the calculation bit string is shifted by one or more bits in lower bit direction, the value of the calculation bit string may be decreased by a square of 2. The addition or subtraction between the calculation bit string and the calibration code may be performed at each time when the position of the only one bit, having a logical value of 1 or 0, of the calculation bit string is shifted. The calibration calculation may be iteratively performed until the least significant bit of the calculation bit string becomes the only one bit having a logical value of 1 or 0.

In one example, it is assumed that a target calibration code (i.e., a calibration code encoding a target value Rtarget (refer to FIGS. 3 to 7) of the termination resistance) corresponding to such a case that a termination resistance and an external resistance are matched is '100010'. Also, it is assumed that a calibration code initially stored in a register (not shown) of resistance calibration logic 140a (refer to FIG. 1) is '011111'. Further, it is assumed that the only one bit of the calculation bit string has a logical value of 1. Furthermore, it is assumed that the position of the only one bit, having a logical value of 1, of the calculation bit string is shifted by one bit in lower bit direction. However, the above assumptions are exemplary for better understanding. In addition, precisely, one of addition and subtraction between the calculation bit string and the calibration code may be performed according to the comparison signal, however, it will be described, for better understanding, that the target calibration code is compared with the calibration code stored in the register.

In a first step of the calibration calculation, a target calibration code '100010' and a stored calibration code '011111' are compared. Since the target calibration code '100010' is greater than the stored calibration code '011111', the calculation bit string is added to the stored calibration code to increase a value of the stored calibration code. Precisely, for example, a comparison signal indicating that a voltage of the comparison target node is higher than the reference voltage is generated, and the calculation bit string is added to the stored calibration code according to the generated comparison signal. In the first step of the calibration calculation, the most significant bit of the calculation bit string may be the only one bit having a logical value of 1. The calculation bit string '100000' is added to the stored calibration code '011111', thus, the calibration code '111111' is stored.

In a second step of the calibration calculation, the target calibration code '100010' and the stored calibration code '111111' are compared. Since the stored calibration code is greater than the target calibration code, the calculation bit string is subtracted from the stored calibration code to decrease the value of the stored calibration code. In the second step of the calibration calculation, a second upper bit of the calculation bit string may be the only one bit having a logical value of 1. The calculation bit string '010000' is subtracted from the stored calibration code '111111', thus, the calibration code '101111' is stored.

In a third step of the calibration calculation, the target calibration code '100010' and the stored calibration code '101111' are compared. Since the stored calibration code is greater than the target calibration code, the calculation bit string is subtracted from the stored calibration code to decrease the value of the stored calibration code. In the third step of the calibration calculation, a third upper bit of the calculation bit string may be the only one bit having a logical value of 1. The calculation bit string '001000' is subtracted from the stored calibration code '101111', thus, the calibration code '100111' is stored.

Fourth to sixth steps of the calibration calculation are performed in the above-described manner. The calibration calculation is performed until the least significant bit of the calculation bit string has a logical value of 1 (i.e., the sixth step). In the sixth step of the calibration calculation, the calculation bit string '000001' is added to the stored calibration code '100001', thus, the calibration code '100010' is stored. If the sixth step of the calibration calculation is ended, the target calibration code and the stored calibration code have the same value of '100010'. The resistance calibration logic 140a may output '100010' as the updated calibration code P[5:0].

When the calibration calculation utilizing the binary search algorithm is performed, a calculation may be performed N times to generate the updated calibration code P[N-1:0]. The number of calculations necessary for performing the calibration calculation when the binary search algorithm is utilized is less than that when an up/down counter is used. Thus, when the calibration calculation utilizing the binary search algorithm is performed, time for performing the calibration calculation may be reduced, and efficiency of the calibration calculation may be improved. Furthermore, a method to further reduce time for performing the calibration calculation will be more fully described with reference to FIGS. 10 to 12.

Figure 10:
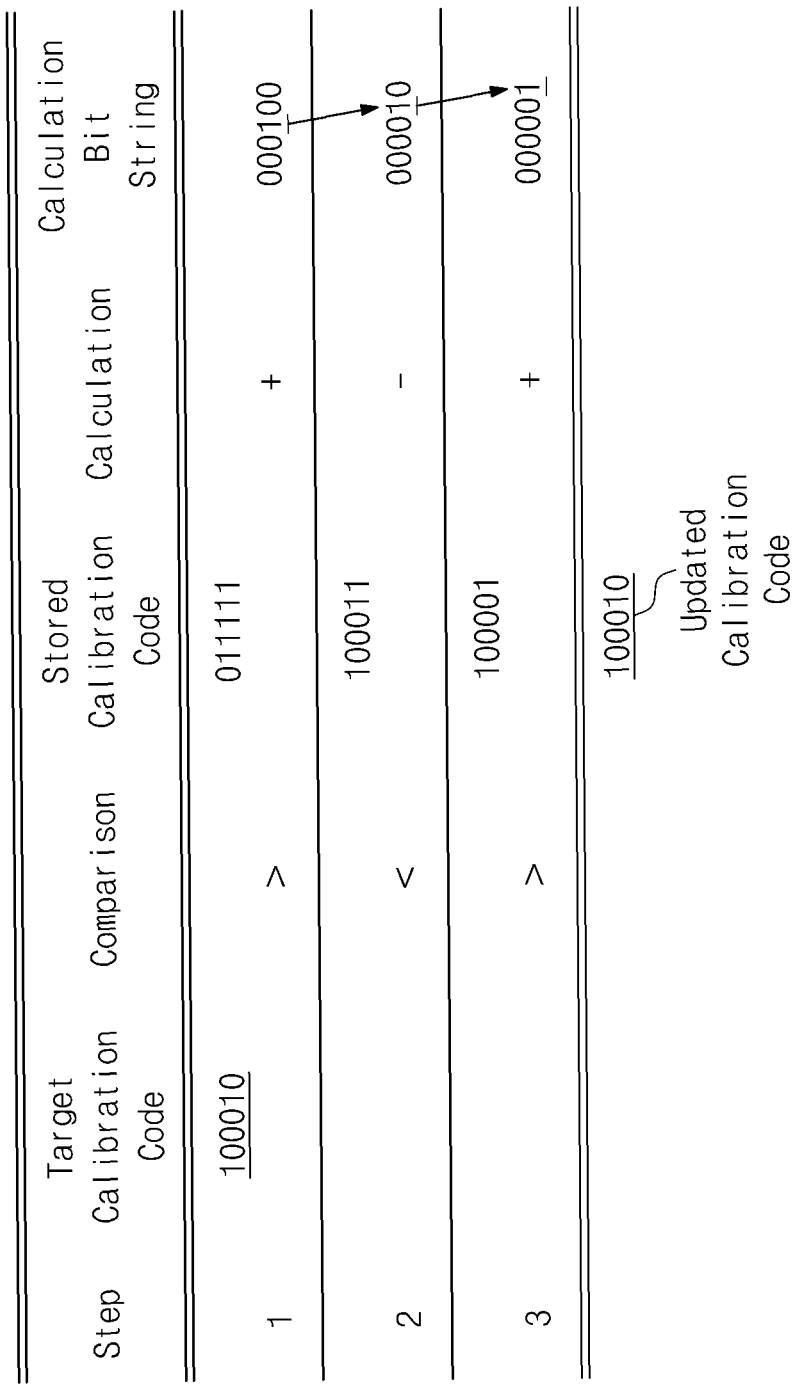
FIGS. 10 to 12 are conceptual diagrams for describing position information included in a bit position signal according to exemplary embodiments.
Figure 11:
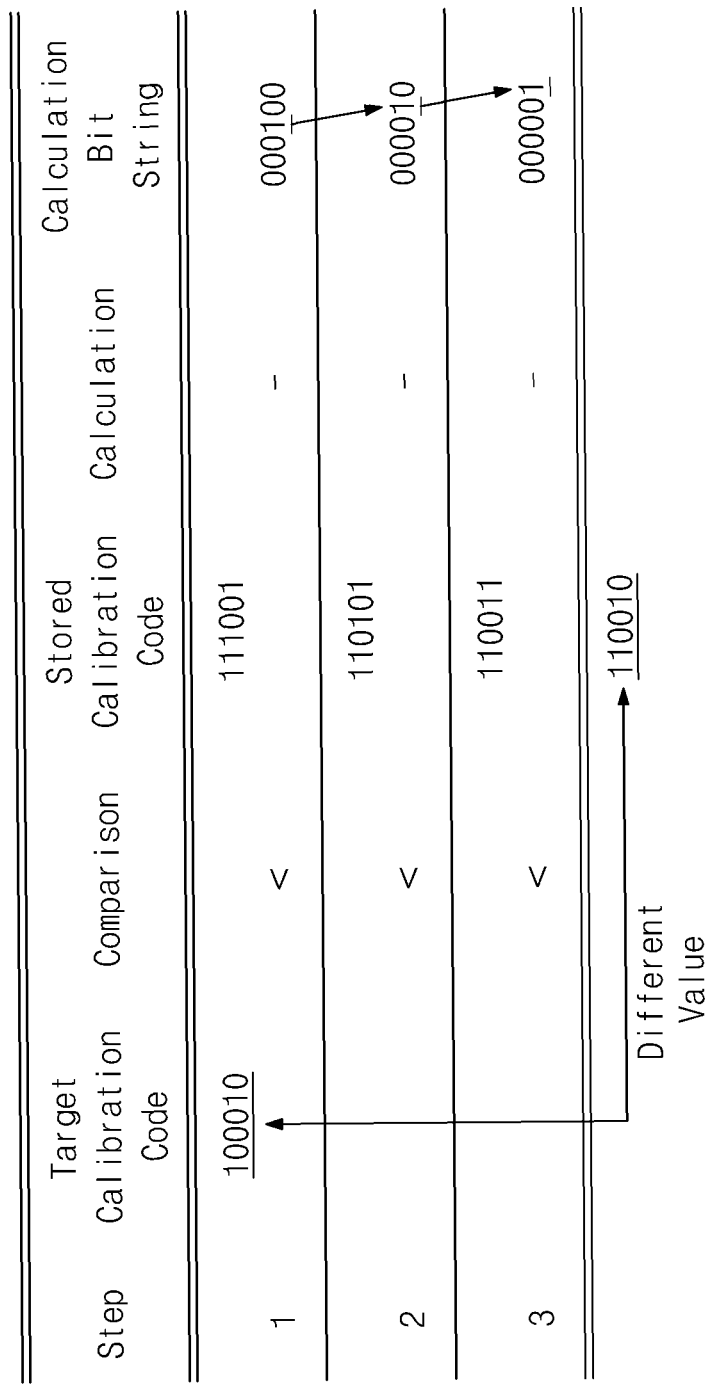
Figure 12:
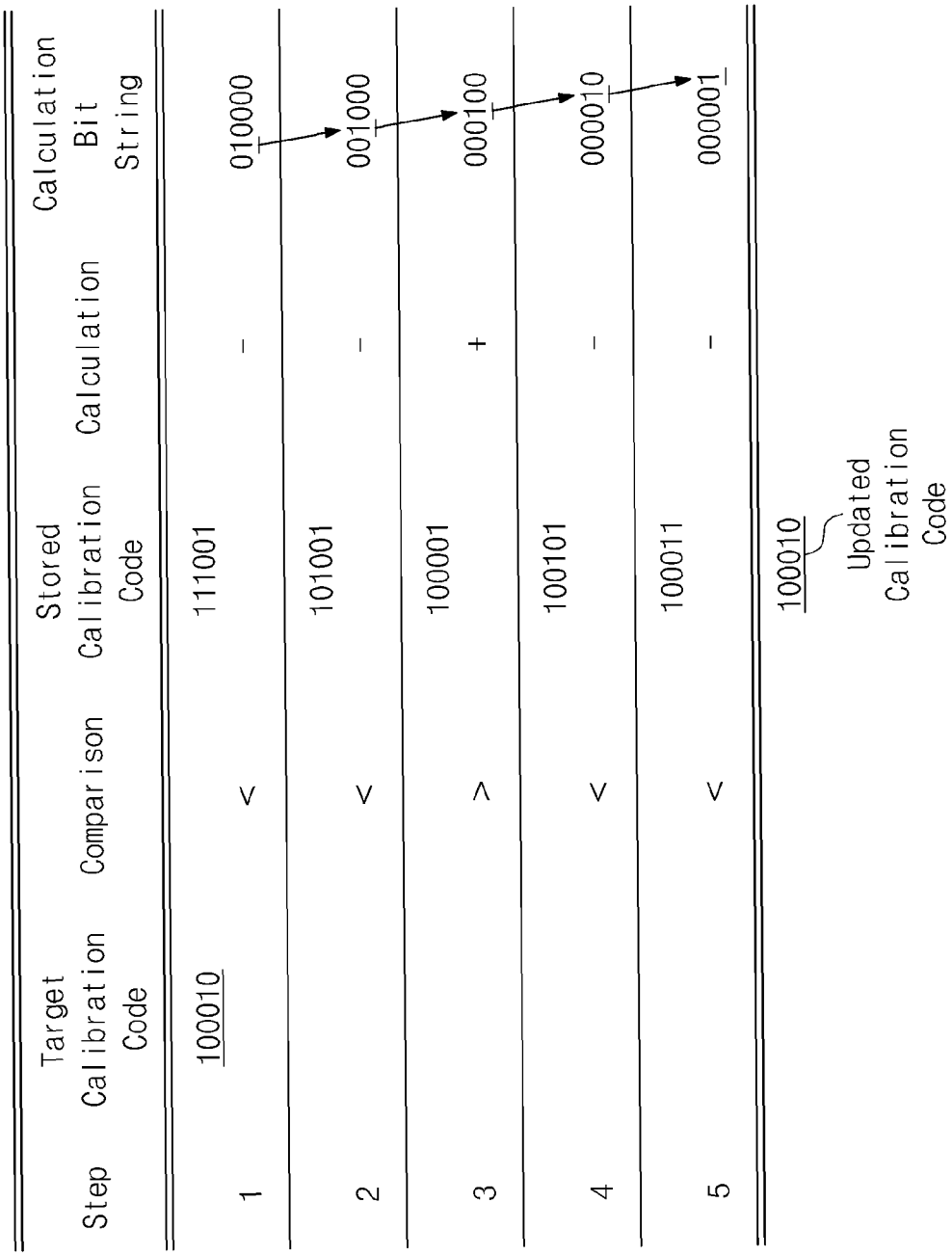

FIGS. 10 to 12 are conceptual diagrams for describing position information included in a bit position signal according to exemplary embodiments. In one embodiment, a bit position signal may be a signal including position information of a bit where a calibration calculation starts. A position of the bit where a calibration calculation starts may be varied according to the bit position signal. In an embodiment shown in FIGS. 10 to 12, it is assumed that an upper critical value and a lower critical value are '111' and '000', respectively. This assumption is exemplary and is not for limiting the spirit and scope of the disclosure.

Referring to FIG. 10, a target calibration code corresponding to the case that a termination resistance and an external resistance are matched is '100010', and a calibration code initially stored in a register (not shown) of resistance calibration logic 140a (refer to FIG. 1) is '011111'. An upper bit string P[5:3] of the stored calibration code is '011'. The upper bit string P[5:3] of '011' is less than the upper critical value '111' and greater than the lower critical value '000'. This means that a value of the calibration code needs not to be adjusted in an increasing direction or in a decreasing direction for impedance matching between the termination resistance and the external resistance. In this case, the number of calibration calculations performed to make the stored calibration code become the same as the target calibration code needs not to be many. For example, in an example shown in FIG. 10, an updated calibration code P[5:0] may be generated through only three calculations. In the example shown in FIG. 10, bits located at from the most significant bit to a third upper bit among the calculation bit string need not to have a logical value of 1. It is enough to make each of bits located at from the least significant bit to a third lower bit among the of the calculation bit string become only one bit having a logical value of 1.

Referring to FIGS. 11 and 12, the target calibration code corresponding to the case that the termination resistance and the external resistance are matched is '100010', and a calibration code initially stored in the register (not shown) of the resistance calibration logic 140a is '111001'. An upper bit string P[5:3] of the stored calibration code is '111'. The upper bit string P[5:3] is the same as the upper critical value. This means that the value of the calibration code is largely increased for impedance matching between the termination resistance and the external resistance at a previous calibration calculation. In this case, the number of calibration calculations performed to make the stored calibration code become the same as the target calibration code needs to be many. As shown in FIG. 11, if only three calculations are performed like an example shown in FIG. 10, the stored calibration code may not become the same as the target calibration code. Therefore, it is difficult to appropriately generate the updated calibration code P[5:0].

As understood from FIG. 12, there are required five calculations to make the stored calibration code become the same as the target calibration code. For example, the updated calibration code P[5:0] may be appropriately generated by setting the most significant bit of the calculation bit string as the only one bit having a logical value of 1.

With the above description, the number of calibration calculations required to generate the updated calibration code P[N-1:0] may be variable according to a value of the upper bit string P[N-1:N-k]. The number of calibration calculations needed when the upper bit string P[N-1:N-k] is equal to or greater than the upper critical value, or equal to or less than the lower critical value may be relatively more. On the other hand, the number of calibration calculations needed when the upper bit string P[N-1:N-k] is less than the upper critical value and greater than the lower critical value may be relatively less. Thus, time for performing the calibration calculation may be minimized by changing a position of a bit where the calibration calculation starts, according to the value of the upper bit string P[N-1:N-k]. The bit position signal including the position information of the bit where the calibration calculation starts may be utilized to improve efficiency of the calibration calculation.

Figure 13:
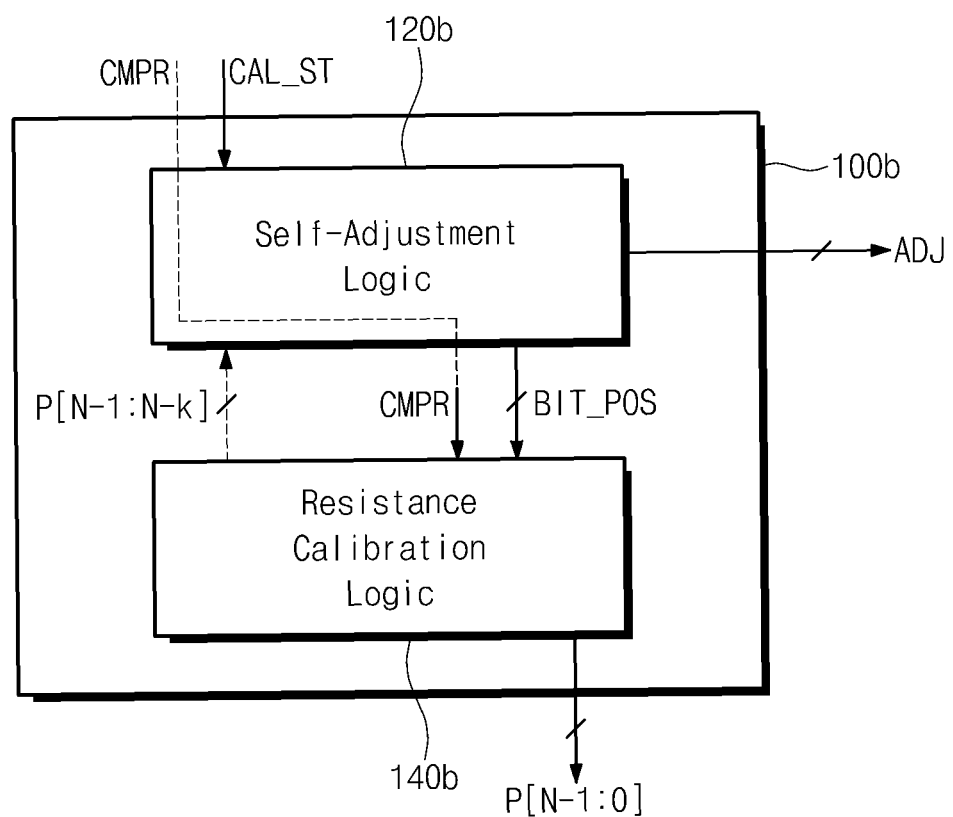
FIG. 13 is a block diagram schematically illustrating a termination resistance calibration circuit according to another exemplary embodiment.

FIG. 13 is a block diagram schematically illustrating a termination resistance calibration circuit according to another exemplary embodiment. A termination resistance calibration circuit 100b includes a self-adjustment logic 120b and a resistance calibration logic 140b. The termination resistance calibration circuit 100b may be included in a semiconductor memory device. The self-adjustment logic 120b and the resistance calibration logic 140b may include configurations and functions of self-adjustment logic 120a (refer to FIG. 1) and resistance calibration logic 140a (refer to FIG. 1), respectively. An overlapped description on the self-adjustment logic 120b and the resistance calibration logic 140b is omitted.

The self-adjustment logic 120b may start to operate in response to a calibration start signal CAL_ST. The self-adjustment logic 120b may refer to an upper bit string P[N-1:N-k]. The self-adjustment logic 120b may determine whether a value of the upper bit string P[N-1:N-k] is equal to or greater than an upper critical value, or equal to or less than a lower critical value. The self-adjustment logic 120b may generate an adjustment signal ADJ based on the determination result.

The self-adjustment logic 120b may further generate a bit position signal BIT_POS based on the determination result. As described above, the bit position signal BIT_POS may include position information of a bit, of a calibration code, where a calibration calculation starts. A position of the bit where the calibration calculation starts may be varied according to the upper bit string P[N-1:N-k]. For example, position information included in the bit position signal BIT_POS when the value of the upper bit string P[N-1:N-k] is equal to or greater than the upper critical value, or equal to or less than the lower critical value may be different from that when the value of the upper bit string P[N-1:N-k] is less than the upper critical value and greater than the lower critical value.

When the value of the upper bit string P[N-1:N-k] is less than the upper critical value and greater than the lower critical value, the number of calibration calculations needed to generate an updated calibration code P[N-1:0] may not be many. The reason is why a value of the calibration code needs not to be largely increased or decreased for impedance matching between a termination resistance and an external resistance. In this case, thus, the calibration calculation may be performed from a bit position of one of remaining bits of the calibration code other than the upper bit string P[N-1:N-k]. For example, as shown in FIG. 10, the calibration calculation may be performed from a third lower bit.

On the other hand, when the value of the upper bit string P[N-1:N-k] is equal to or greater than the upper critical value, or equal to or less than the lower critical value, the number of calibration calculations needed to generate the updated calibration code P[N-1:0] may be many. The reason is why the value of the calibration code needs to be largely increased or decreased for impedance matching between the termination resistance and the external resistance.

In this case, the calibration calculation may be performed from a bit position of one of bits included in the upper bit string P[N-1:N-k] of the calibration code. For instance, as shown in FIG. 12, the calibration calculation may be performed from a first upper bit.

The resistance calibration logic 140b may receive a comparison signal CMPR and the bit position signal BIT_POS. The resistance calibration logic 140b may perform a calibration calculation based on the comparison signal CMPR, the bit position signal BIT_POS, and a calibration code stored in a register. A process of the calibration calculation is described in detail by referring to FIGS. 8 to 12. In particular, the resistance calibration logic 140b may perform the calibration calculation from a bit position indicated by the bit position signal BIT_POS. In this embodiment, the calibration calculation may be a calculation utilizing a binary search algorithm.

When the calibration calculation is ended, the resistance calibration logic 140b may generate an updated calibration code P[N-1:0]. For example, the updated calibration code P[N-1:0] may correspond to the calibration code stored in a register of the resistance calibration logic 140b when the calibration calculation is ended. A value of the termination resistance of a data output driver may be first adjusted by the adjustment signal ADJ. Then, the termination resistance having the value adjusted by the adjustment signal ADJ may be calibrated by the updated calibration code P[N-1:0]. For example, the termination resistance of the data output driver may be matched with the external resistance through a step for adjusting a value by the adjustment signal ADJ and a step for calibrating by the updated calibration code P[N-1:0].

According to disclosed embodiments, the termination resistance may be calibrated within short time. In particular, it is possible to overcome a time limitation without influence on a property of the data output driver. Thus, as a time margin is sufficiently secured, a calibration interval of a pull-up resistance may not be overlapped with that of a pull-down resistance. Accordingly, reliability of calibration with respect to the termination resistance may be improved.

Figure 14:
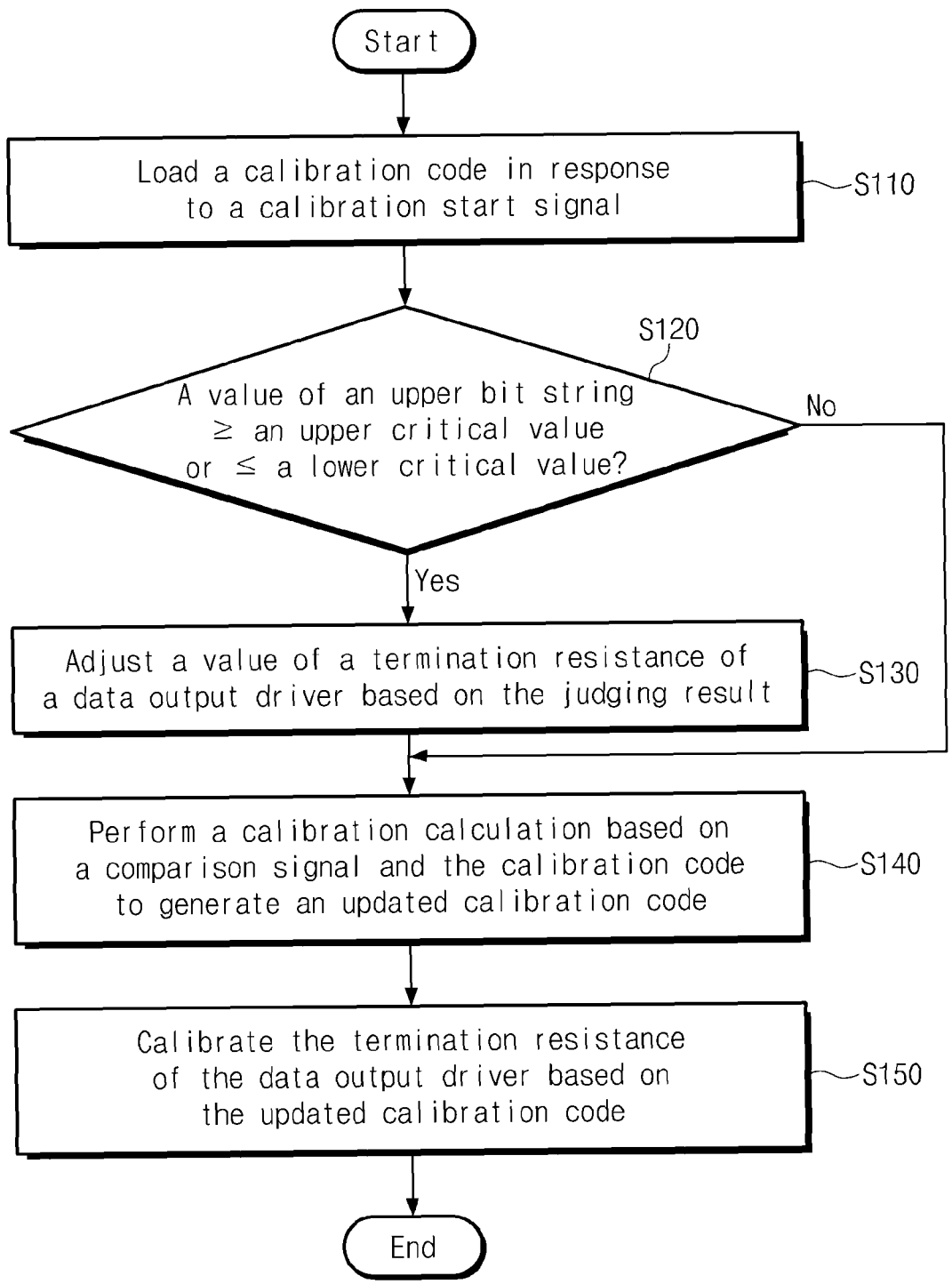
FIG. 14 is a flow chart for describing a termination resistance calibration method according to an exemplary embodiment.

FIG. 14 is a flow chart for describing a termination resistance calibration method according to an exemplary embodiment. The termination resistance calibration method may calibrate a termination resistance of a semiconductor memory device including the termination resistance.

In step S110, a calibration code may be loaded. The calibration code may be formed of plural bits. Loading the calibration code may be performed in response to a calibration start signal.

In step S120, whether a value of an upper bit string of the calibration code is equal to or greater than an upper critical value, or equal to or less than a lower critical value may be determined. The lower critical value may be less than the upper critical value. If the value of the upper bit string is equal to or greater than the upper critical value, or equal to or less than the lower critical value, the method proceeds to step S130. On the other hand, if the value of the upper bit string is less than the upper critical value and greater than the lower critical value, the method proceeds to step S140. For example, if the value of the upper bit string is less than the upper critical value and greater than the lower critical value an adjustment signal may be generated in the step S120. In this case, the adjustment signal may indicate that there is no need to adjust a value of the termination resistance.

In the step S130, a value of the termination resistance of a data output driver may be adjusted by an adjustment signal generated based on the determination result. The step S130 may be performed when the value of the upper bit string is equal to or greater than the upper critical value, or equal to or less than the lower critical value. A detailed description on adjustment of the value of the termination resistance may be mentioned together with a description on FIGS. 3 to 8. In particular, in step S130, the value of the termination resistance may be adjusted in an increasing direction or a decreasing direction. Adjusted direction of the value of the termination resistance of the data output driver when the value of the upper bit string is equal to or greater than the upper critical value is different from that when the value of the upper bit string is equal to or less than the lower critical value. For example, an adjustment signal may be generated in the step S130 to adjust a value of the termination resistance.

In the step S140, an updated calibration code for calibrating the termination resistance may be generated. A calibration calculation for generating the updated calibration code may be performed. The calibration calculation may be performed according to a comparison signal and the calibration code. The calibration calculation may be also performed based on the calibration code and the adjustment signal. A description of the calibration calculation is mentioned together with a description on FIGS. 8 to 12.

In step S150, the termination resistance of the data output driver may be calibrated. The termination resistance may be calibrated based on the updated calibration code generated in the step S140. In particular, the updated calibration code may calibrate the termination resistance having a value adjusted in step S130.

Figure 15:
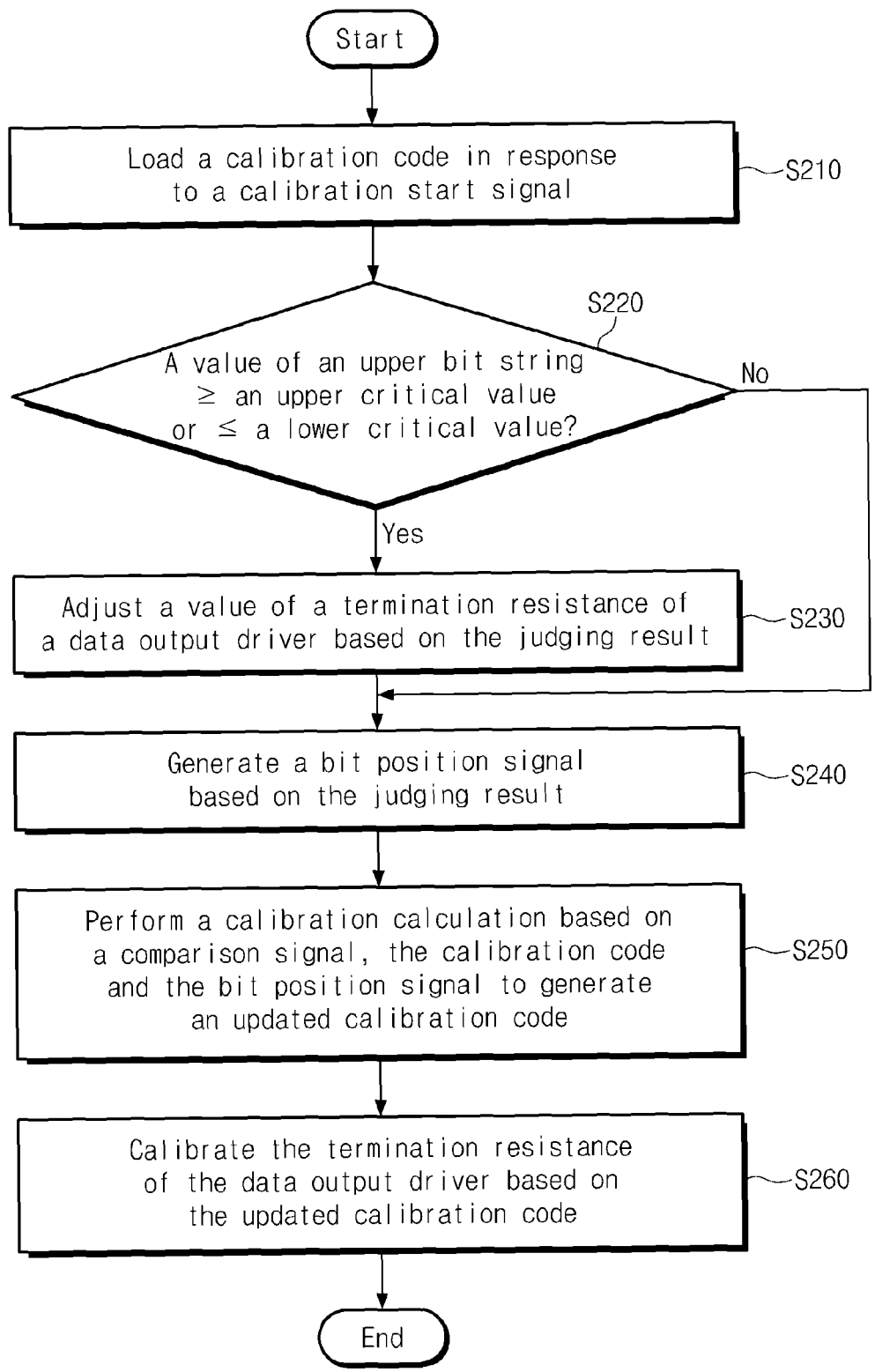
FIG. 15 is a flow chart for describing a termination resistance calibration method according to another exemplary embodiment.

FIG. 15 is a flow chart for describing a termination resistance calibration method according to another exemplary embodiment. Steps S210, S220, and S230 may include processes performed in S110, S120, and S130 shown in FIG. 14, respectively. Thus, an overlapped description on the steps S210, S220, and S230 is omitted In step S240, a bit position signal including position information of a bit where a calibration calculation starts may be generated. The bit position signal may be generated based on a determination result of the step S220. As aforementioned, when the value of the upper bit string is equal to or greater than the upper critical value, or is equal to or less than the lower critical value, the bit position signal may include position information of one of bits included in the upper bit string. On the other hand, when the value of the upper bit string is less than the upper critical value and greater than the lower critical value, the bit position signal may include position information of one of remaining bits of a calibration code other than the upper bit string.

A proceeding order of the steps S230 and S240 may be changed. For example, the step S240 may be performed prior to the step S230. The reason is why both of the steps S230 and S240 are performed based on the determination result of the step S220. An order of the flow chart shown in FIG. 15 is exemplary for better understanding and is not for limiting the spirit and scope of the disclosure.

In step S250, an updated calibration code for calibrating a termination resistance may be generated. A calibration calculation may be performed to generate the updated calibration code. The calibration calculation may be performed based on a comparison signal and the bit position signal generated in the step S240. A description of the calibration calculation is mentioned together with a description on FIGS. 8 to 12. In particular, as mentioned together with a description on FIG. 9, the calibration calculation may be a calculation utilizing a binary search algorithm. In addition, as mentioned together with a description on FIGS. 10 to 12, the calibration calculation may be performed from a position of a bit indicated by the bit position signal generated in the step S240. The updated calibration code may correspond to a calibration code that is finally obtained when the calibration calculation is ended.

In step S260, the termination resistance of the data output driver may be calibrated. The termination resistance may be calibrated based on the updated calibration code generated in the step S250. In particular, the updated calibration code may calibrate the termination resistance having a value adjusted in the step S230.

Figure 16:
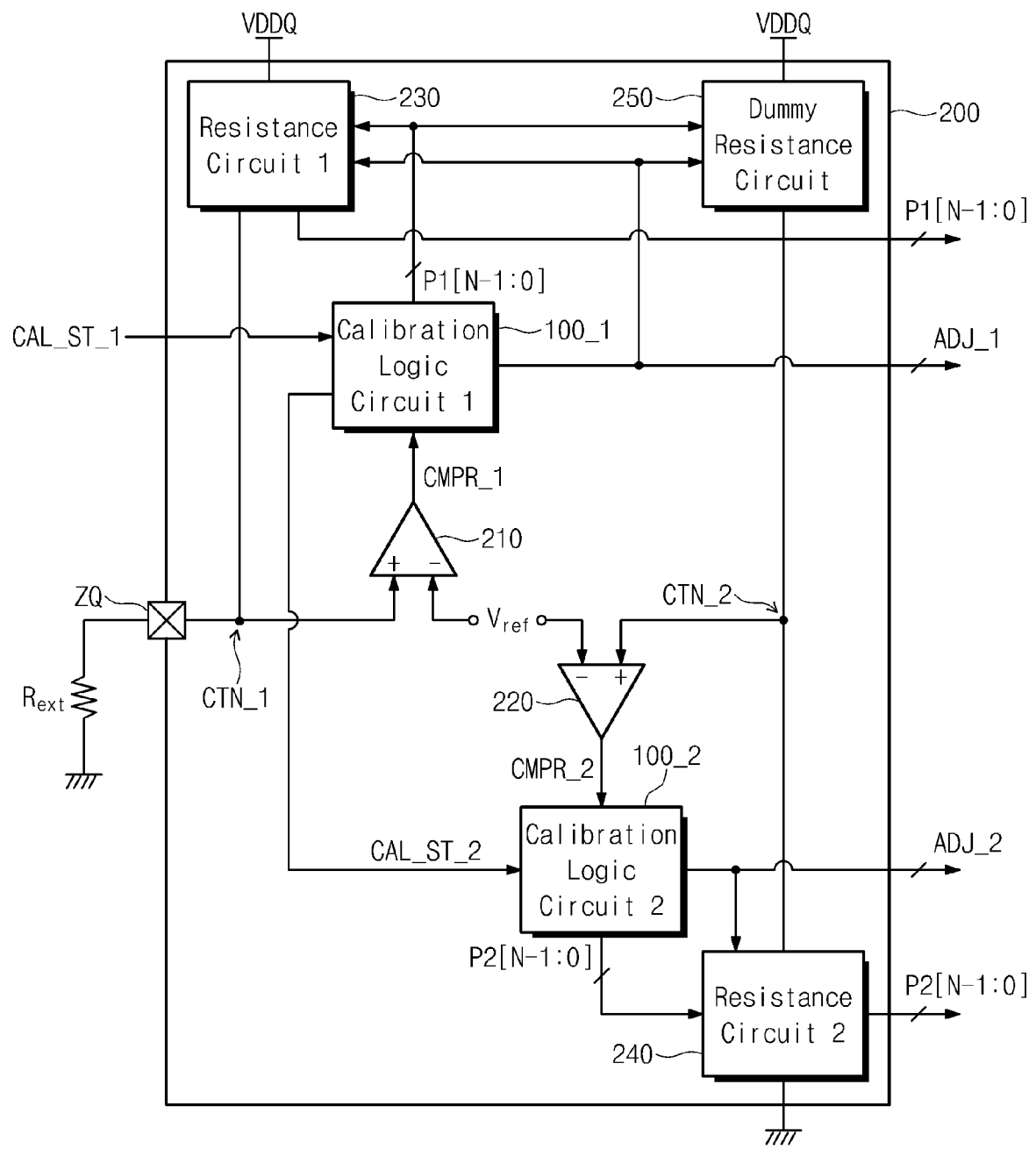
FIG. 16 is a block diagram schematically illustrating a termination resistance calibration circuit according to exemplary embodiments.

FIG. 16 is a block diagram schematically illustrating a termination resistance calibration circuit according to exemplary embodiments. A termination resistance calibration circuit 200 may match an external resistance Rext and a termination resistance through a ZQ pad ZQ. The termination resistance calibration circuit 200 includes a first comparator 210, a second comparator 220, a first calibration logic circuit 100_1, a second calibration logic circuit 100_2, a first resistance circuit 230, a second resistance circuit 240, and a dummy resistance circuit 250. The termination resistance calibration circuit 200 may be included in a semiconductor memory device.

The first comparator 210 may generate a first comparison signal CMPR_1. The first comparison signal CMPR_1 may be generated based on a result of comparing a reference voltage Vref with a voltage of a first comparison target node CTN_1. A value of the first comparison signal CMPR_1 may be variable according to a magnitude relationship between the reference voltage Vref and the voltage of the first comparison target node CTN_1. The first comparison target node CTN_1 may be an output terminal of the first resistance circuit 230.

The first calibration logic circuit 100_1 may receive a first calibration start signal CAL_ST_1. For instance, the first calibration start signal CAL_ST_1 may be generated by a command decoder (not shown) included in a memory system. The first calibration logic circuit 100_1 may begin to operate in response to the first calibration start signal CAL_ST_1, and may generate a first calibration code.

The first calibration logic circuit 100_1 may refer to a first upper bit string corresponding to one or more upper bits of the first calibration code. The first calibration code may be a code for calibrating a first termination resistance. Data corresponding to the first calibration code may be stored in a register (not shown) included in the first calibration logic circuit 100_1. The first calibration logic circuit 100_1 may perform a first determination associated with whether a value of the first upper bit string is equal to or greater than a first upper critical value, or equal to or less than a first lower critical value. The first lower critical value may be less than the first upper critical value. The first upper critical value and the first lower critical value may be randomly set as necessary. The first calibration logic circuit 100_1 may also generate a first adjustment signal ADJ_1 based on a result of the first determination. The first adjustment signal ADJ_1 may be a signal for adjusting a value of the first termination resistance. The first adjustment signal ADJ_1 may be provided to a data output driver. Also, the first adjustment signal ADJ_1 may be provided to the first resistance circuit 230.

The first calibration logic circuit 100_1 may perform a first calibration calculation based on the first comparison signal CMPR_1 generated based on the first calibration code stored in the register and the first adjustment signal ADJ_1. The first calibration calculation may be performed according to such a method as a calibration calculation described with reference to FIGS. 8 to 12. In exemplary embodiments, if a voltage of the first comparison target node CTN_1 is higher than the reference voltage Vref, the first calibration logic circuit 100_1 may increase (or decrease) a value of the first calibration code to calibrate a resistance of the first resistance circuit 230, thus, the voltage of the first comparison target node CTN_1 may be decreased. On the other hand, if the voltage of the first comparison target node CTN_1 is lower than the reference voltage Vref, the first calibration logic circuit 100_1 may decrease (or increase) the value of the first calibration code to calibrate the resistance of the first resistance circuit 230, thus, the voltage of the first comparison target node CTN_1 may be increased.

When the first calibration calculation is ended, the resistance of the first resistance circuit 230 and the external resistance Rext may be matched. The first calibration code when the resistance of the first resistance circuit 230 and the external resistance Rext are matched may be a first updated calibration code P1[N-1:0]. The first updated calibration code P1[N-1:0] may calibrate resistances of the first resistance circuit 230 and the dummy resistance circuit 250.

The first resistance circuit 230 and the dummy resistance circuit 250 may be implemented to have the same configuration as a variable resistance circuit 160 (refer to FIG. 2). Transistors included in the first resistance circuit 230 may be turned on or off by the first calibration code or the first updated calibration code P1[N-1:0]. Thus, the resistance of the first resistance circuit 230 may be calibrated by the first calibration code or the first updated calibration code P1[N-1:0]. The resistance of the first resistance circuit 230 may be matched with the external resistance Rext by the first updated calibration code P1[N-1:0]. The first updated calibration code P1[N-1:0] for impedance matching between the resistance of the first resistance circuit 230 and the external resistance Rext may be provided to the data output driver.

In particular, the value of the first termination resistance of the data output driver may be first adjusted by the first adjustment signal ADJ_1. Then, the first termination resistance having a value adjusted by the first adjustment signal ADJ_1 may be calibrated by the first updated calibration code P1[N-1:0]. For example, the first termination resistance may be matched with the external resistance Rext through a step for adjusting a value by the adjustment signal ADJ_1 and a step for calibrating by the first updated calibration code P1[N-1:0]. When the first calibration calculation is ended, the first calibration logic circuit 100_1 may generate a second calibration start signal CAL_ST_2.

The first calibration logic circuit 100_1 may be implemented by a termination resistance calibration circuit 100a shown in FIG. 1 or a termination resistance calibration circuit 100b shown in FIG. 13. The first calibration logic circuit 100_1 may include a first self-adjustment logic (not shown) and a first resistance calibration logic (not shown). The first self-adjustment logic may perform the first determination in response to the first calibration start signal CAL_ST_1. The first self-adjustment logic may generate the first adjustment signal ADJ_1 based on the result of the first determination. The first resistance calibration logic may provide a first upper bit string to the first self-adjustment logic. The first resistance calibration logic may perform the first calibration calculation based on the first comparison signal CMPR_1. When the first calibration calculation is ended, the resistance calibration logic may generate the first updated calibration code P1[N-1:0] and the second calibration start signal CAL_ST_2.

The second comparator 220 may generate a second comparison signal CMPR_2. The second comparison signal CMPR_2 may be generated based on a result of comparing the reference voltage Vref and a voltage of a second comparison target node CTN_2. A value of the second comparison signal CMPR_2 may be variable according to a magnitude relationship between the reference voltage Vref and the voltage of the second comparison target node CTN_2. The second comparison target node CTN_2 may be an output terminal of the dummy resistance circuit 250.

The second calibration logic circuit 100_2 may receive a second calibration start signal CAL_ST_2. For instance, the second calibration start signal CAL_ST_2 may be generated by the first calibration logic circuit 100_1. The second calibration logic circuit 100_2 may begin to operate in response to the second calibration start signal CAL_ST_2, and may generate a second calibration code.

The second calibration logic circuit 100_2 may refer to a second upper bit string corresponding to one or more upper bits of the second calibration code. The second calibration code may be a code for calibrating a second termination resistance. The number of bits of the second calibration code may be the same as that of the first calibration code, and the number of bits of the second upper bit string may be the same as that of the first upper bit string. However, the disclosure is not limited thereto. Data corresponding to the second calibration code may be stored in a register (not shown) included in the second calibration logic circuit 100_2.

The second calibration logic circuit 100_2 may perform a second determination associated with whether a value of the second upper bit string is equal to or greater than a second upper critical value, or equal to or less than a second lower critical value. The second lower critical value may be less than the second upper critical value. The second upper critical value and the second lower critical value may be equal to the first upper critical value and the first lower critical value, respectively. However, the disclosure is not limited thereto. The second upper critical value and the second lower critical value may be randomly set as necessary. The second calibration logic circuit 100_2 may also generate a second adjustment signal ADJ_2 based on a result of the second determination. The second adjustment signal ADJ_2 may be a signal for adjusting a value of the second termination resistance. The second adjustment signal ADJ_2 may be provided to the data output driver. Also, the second adjustment signal ADJ_2 may be provided to the second resistance circuit 240.

The second calibration logic circuit 100_2 may perform a second calibration calculation based on the second comparison signal CMPR_2 generated based on the second calibration code stored in the register and the second adjustment signal ADJ_2. The second calibration calculation may be performed according to such a method as a calibration calculation described with reference to FIGS. 8 to 12. In exemplary embodiments, if a voltage of the second comparison target node CTN_2 is higher than the reference voltage Vref, the second calibration logic circuit 100_2 may increase (or decrease) a value of the second calibration code to calibrate a resistance of the second resistance circuit 240, thus, the voltage of the second comparison target node CTN_2 may be decreased. On the other hand, if the voltage of the second comparison target node CTN_2 is lower than the reference voltage Vref, the second calibration logic circuit 100_2 may decrease (or increase) the value of the second calibration code to calibrate a resistance of the second resistance circuit 240, thus, the voltage of the second comparison target node CTN_2 may be increased.

When the second calibration calculation is ended, the resistance of the second resistance circuit 240 and the external resistance Rext may be matched. The second calibration code when the resistance of the second resistance circuit 240 and the external resistance Rext are matched may be a second updated calibration code P2[N-1:0]. The second updated calibration code P2[N-1:0] may calibrate a resistance of the second resistance circuit 240.

The second resistance circuit 240 may be implemented to have the same configuration as the variable resistance circuit 160 (refer to FIG. 2). Transistors included in the second resistance circuit 240 may be turned on or off by the second calibration code or the second updated calibration code P2[N-1:0]. Thus, the resistance of the second resistance circuit 240 may be calibrated by the second calibration code or the second updated calibration code P2[N-1:0]. The resistance of the second resistance circuit 240 may be matched with the external resistance Rext by the second updated calibration code P2[N-1:0]. The second updated calibration code P2[N-1:0] for impedance matching between the resistance of the second resistance circuit 240 and the external resistance Rext may be provided to the data output driver.

In particular, the value of the second termination resistance of the data output driver may be first adjusted by the second adjustment signal ADJ_2. Then, the second termination resistance having a value adjusted by the second adjustment signal ADJ_2 may be calibrated by the second updated calibration code P2[N-1:0]. For example, the second termination resistance may be matched with the external resistance Rext through a step for adjusting a value by the adjustment signal ADJ_2 and a step for calibrating by the second updated calibration code P2[N-1:0].

The second calibration logic circuit 100_2 may be implemented by a termination resistance calibration circuit 100a shown in FIG. 1 or a termination resistance calibration circuit 100b shown in FIG. 13. The second calibration logic circuit 100_2 may include a second self-adjustment logic (not shown) and a second resistance calibration logic (not shown). The second self-adjustment logic may perform the second determination in response to the second calibration start signal CAL_ST_2. The second self-adjustment logic may generate the second adjustment signal ADJ_2 based on the result of the second determination. The second resistance calibration logic may provide a second upper bit string to the second self-adjustment logic. The second resistance calibration logic may perform the second calibration calculation based on the second comparison signal CMPR_2. When the second calibration calculation is ended, the second resistance calibration logic may generate the second updated calibration code P2[N-1:0].

Figure 17:
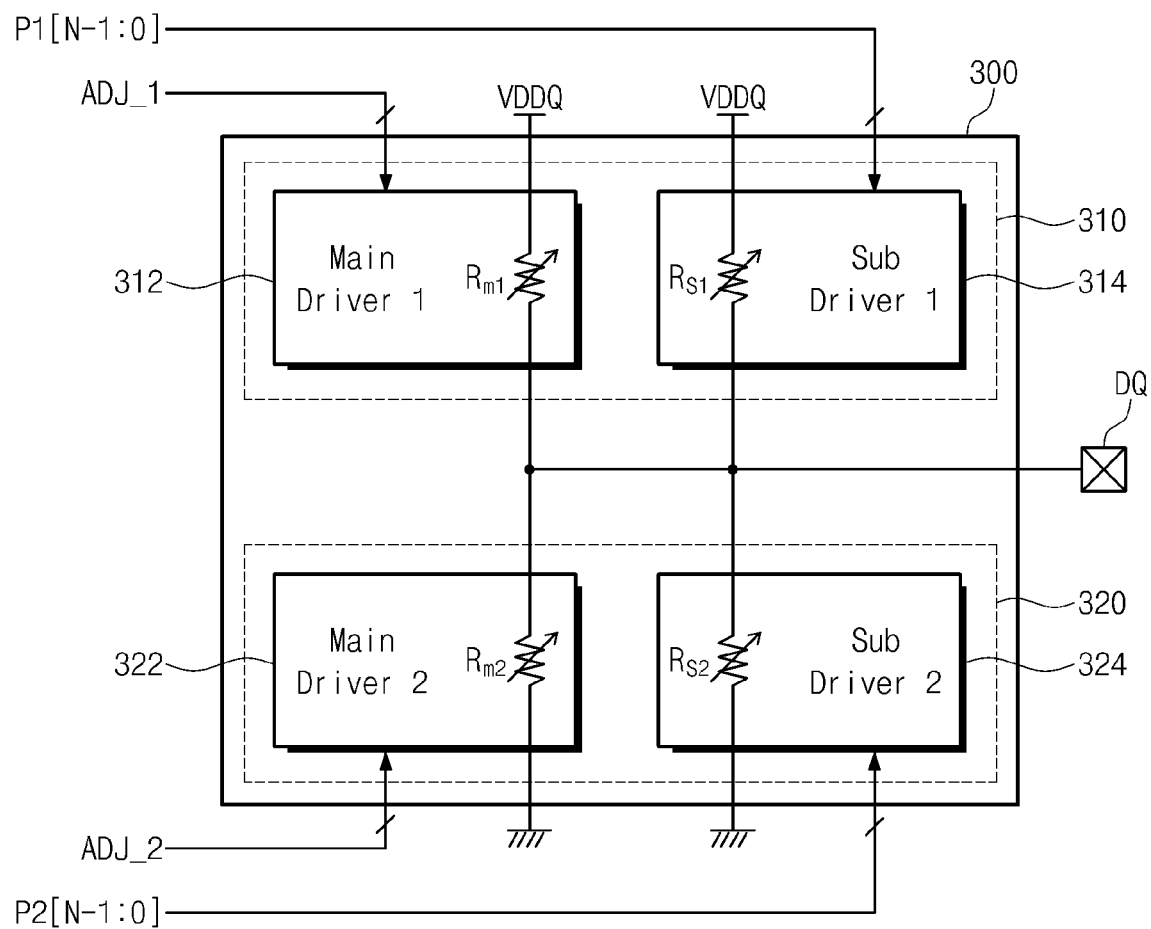
FIG. 17 is a block diagram for describing a process to change values of first and second termination resistances of a data output driver by first and second updated calibration codes and first and second adjustment signals, according to exemplary embodiments.

FIG. 17 is a block diagram for describing a process to change values of first and second termination resistances of a data output driver by first and second updated calibration codes and first and second adjustment signals, according to exemplary embodiments. In FIG. 17, illustrated is a data output driver 300 that outputs data through a DQ pad DQ. The data output driver 300 may include a first output driver 310 and a second output driver 320.

The first output driver 310 may include a first main driver 312 and a first sub driver 314. The first output driver 310 may be a pull-up driver. The first main driver 312 may include a first main driver resistance Rm1. The first sub driver 314 may include a first sub driver resistance Rs1. A first termination resistance of the first output driver 310 may be formed of the first main driver resistance Rm1 and the first sub driver resistance Rs1. For example, each of the first main driver 312 and the first sub driver 314 may include the same structure as a variable resistance circuit 160 of FIG. 2, and the first output driver 310 may include the same structure as a first resistance circuit 230 of FIG. 16.

A value of the first termination resistance of the first output driver 310 may be adjusted by changing a value of the first main driver resistance Rm1. The value of the first main driver resistance Rm1 may be changed by a first adjustment signal ADJ_1 generated by a termination resistance calibration circuit 200 (refer to FIG. 16). The value of the first termination resistance may be adjusted, in advance, by the first adjustment signal ADJ_1 for impedance matching between the first termination resistance and an external resistance.

A value of a first updated calibration code P1[N-1:0] generated by the termination resistance calibration circuit 200 may calibrate the first termination resistance by changing a value of the first sub driver resistance Rs1. In particular, the first updated calibration code P1[N-1:0] may calibrate the first termination resistance having a value adjusted by the first adjustment signal ADJ_1. If the first termination resistance is calibrated by the first updated calibration code P1[N-1:0], the first termination resistance and the external resistance may be matched. For example, each of the first adjustment signal ADJ_1 and the first updated calibration code P1[N-1:0] may include data information received from a memory cell array of the semiconductor memory device and/or a control signal.

The second output driver 320 may include a second main driver 322 and a second sub driver 324. The second output driver 320 may be a pull-down driver. The second main driver 322 may include a second main driver resistance Rm2. The second sub driver 324 may include a second sub driver resistance Rs2. A second termination resistance of the second output driver 320 may be formed of a second main driver resistance Rm2 and a second sub driver resistance Rs2. For example, each of the second main driver 322 and the second sub driver 324 may include the same structure as a variable resistance circuit 160 of FIG. 2, and the second output driver 320 may include the same structure as a second resistance circuit 240 of FIG. 16.

A value of the second termination resistance of the second output driver 320 may be adjusted by changing a value of the second main driver resistance Rm2. The value of the second main driver resistance Rm2 may be changed by a second adjustment signal ADJ_2 generated by the termination resistance calibration circuit 200. The value of the second termination resistance may be adjusted, in advance, by the second adjustment signal ADJ_2 for impedance matching between the second termination resistance and the external resistance.

A value of a second updated calibration code P2[N-1:0] generated by the termination resistance calibration circuit 200 may calibrate the second termination resistance by changing a value of the second sub driver resistance Rs2. In particular, the second updated calibration code P2[N-1:0] may calibrate the second termination resistance having a value adjusted by the second adjustment signal ADJ_2. If the second termination resistance is calibrated by the second updated calibration code P2[N-1:0], the second termination resistance and the external resistance may be matched. For example, each of the second adjustment signal ADJ_2 and the second updated calibration code P2[N-1:0] may include data information received from the memory cell array and/or the control signal.

In one embodiment, the second adjustment signal ADJ_2 and the second updated calibration code P2[N-1:0] may be generated when the first termination resistance and the external resistance are matched. In another embodiment, a calibration of the second termination resistance may begin when the first termination resistance and the external resistance are matched.

In one embodiment, a value of the termination resistance may be automatically adjusted without manually controlling the value of the termination resistance by using fuses. Also, the termination resistance may be calibrated within a short period. Thus, as a time margin is sufficiently secured, a calibration interval of a pull-up resistance may not be overlapped with that of a pull-down resistance.

Figure 18:
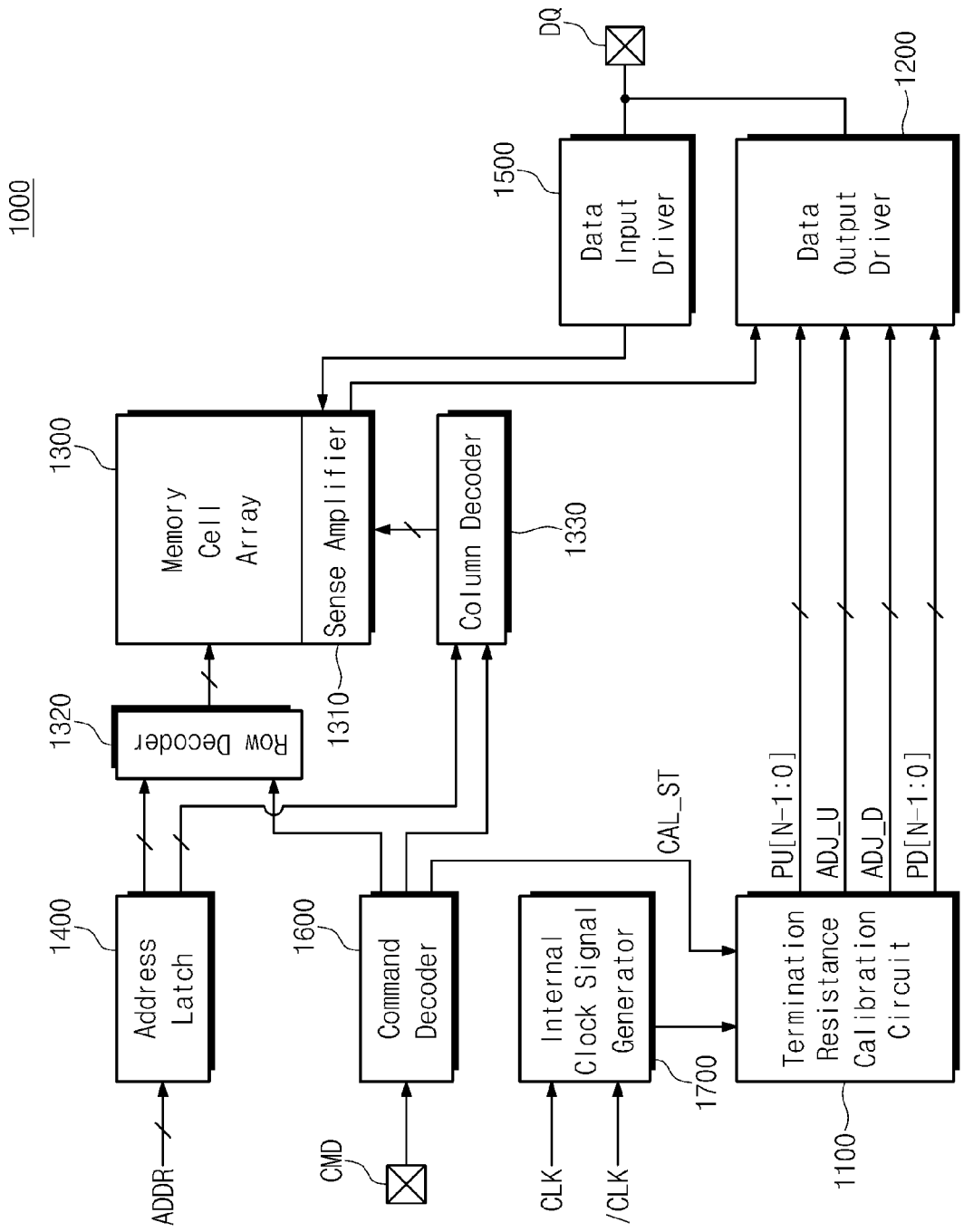
FIG. 18 is a block diagram schematically illustrating a semiconductor memory device according to certain embodiments.

FIG. 18 is a block diagram schematically illustrating a semiconductor memory device according to certain embodiments. A semiconductor memory device 1000 may include a termination resistance calibration circuit 1100, a data output driver 1200, a memory cell array 1300, a sense amplifier 1310, a row decoder 1320, a column decoder 1330, an address latch 1400, a data input driver 1500, a command decoder 1600, and an internal clock signal generator 1700.

In one embodiment, the termination resistance calibration circuit 1100 may be the same as the termination resistance calibration circuit 100a or the termination resistance calibration circuit 100b disclosed herein. The termination resistance calibration circuit 1100 may perform a calibration calculation for impedance matching between a termination resistance and an external resistance as explained above. The termination resistance calibration circuit 1100 may generate a pull-up calibration code PU[N-1:0], a pull-up adjustment signal ADJ_U, a pull-down adjustment signal ADJ_D, and a pull-down calibration code PD[N-1:0]. Impedance matching between the termination resistance and the external resistance may be performed by the pull-up calibration code PU[N-1:0], the pull-up adjustment signal ADJ_U, the pull-down adjustment signal ADJ_D, and the pull-down calibration code PD[N-1:0].

The data output driver 1200 may output data stored in the memory cell array 1300 to the exterior of the semiconductor memory device 1000 through a DQ pad DQ. Data stored in the memory cell array 1300 may be provided to the data output driver through the sense amplifier 1310. The row decoder 1320 and the column decoder 1330 may provide an address ADDR of a memory cell in which data to be outputted is stored to the memory cell array 1300. The address ADDR of the memory cell may be provided to the row decoder 1320 and the column decoder 1330 through the address latch 1400.

External data of the memory system 1000 may be provided to the data input driver 1500 through the DQ pad DQ. Data provided to the data input driver 1500 may be stored in the memory cell array 1300 through the sense amplifier 1310. An address ADDR of a memory cell in which the external data of the semiconductor memory device 1000 is to be stored may be provided to the memory cell array 1300 through the address latch 1400, the row decoder 1320, and the column decoder 1330.

The command decoder 1600 may receive various commands through a command pad CMD. The command decoder 1600 may provide commands to other components such as the row decoder 1320, the column decoder 1330, and so on. Particularly, the command decoder 1600 may provide a calibration start signal CAL_ST to the termination resistance calibration circuit 1100. The calibration start signal CAL_ST may be a ZQCL (ZQ Calibration Long) command or a ZQCS (ZQ Calibration Short) command.

The internal clock signal generator 1700 may generate an internal clock signal based on external clock signals CLK and /CLK. In particular, the termination resistance calibration circuit 1100 may perform a calibration calculation in synchronization with the internal clock signal generated by the internal clock signal generator 1700.

Figure 19:
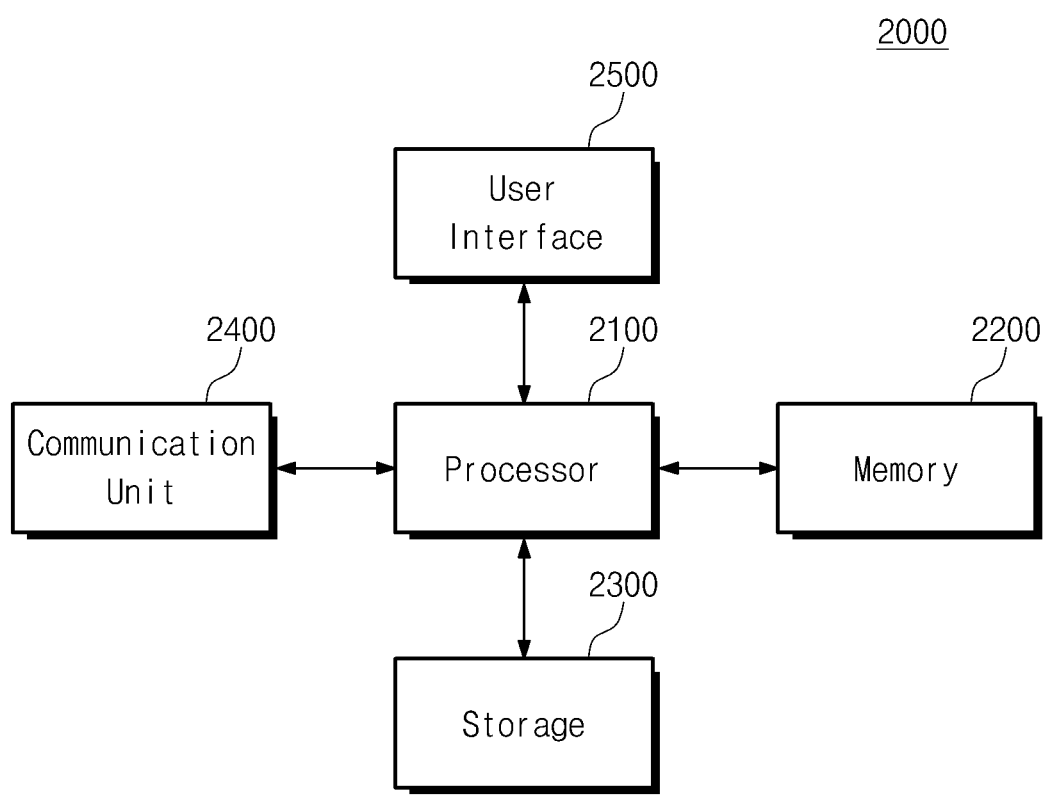
FIG. 19 is a block diagram schematically illustrating a computing system according to certain embodiments.

FIG. 19 is a block diagram schematically illustrating a computing system according to certain embodiments. A computing system 2000 may include a processor 2100, a memory 2200, storage 2300, a communication circuit 2400, and a user interface 2500.

The processor 2100 may control an overall operation of the computing system 2000. The processor 2100 may perform various calculations. The processor 2100 may be implemented in a form of a system-on-chip (SoC). The processor 2100 may be a general purpose processor or an application processor.

The memory 2200 may exchange data with the processor 2100. The memory 2200 may be a main memory of the processor 2100 or the computing system 2000. The memory 2200 may include a volatile memory such as a static RAM, a dynamic RAM, a synchronous DRAM, etc. and/or a nonvolatile memory such as a flash memory, a phase-change RAM (PRAM), a magnetic RAM (MRAM), a resistive RAM (RRAM), a ferroelectric RAM (FRAM), etc. In particular, in the case that the memory 2200 operates at high speed and includes a termination resistance, a termination resistance calibration circuit may be included in the memory 2200. The termination resistance calibration circuit of the memory 2200 may be the same as the termination resistance calibration circuit 100a or the termination resistance calibration circuit 100b disclosed herein. The memory 2200 may include at least one memory module or at least one memory package.

The storage 2300 may be used to store data for long time. The storage 2300 may include a hard disk drive, a flash memory such as a solid state drive (SSD), and/or a nonvolatile memory such as a PRAM, an MRAM, an RRAM, an FRAM, etc. In exemplary embodiments, the memory 2200 and the storage 2300 may be the same type of nonvolatile memory. In this case, the memory 2200 and the storage 2300 may be implemented by a single semiconductor integrated circuit.

The communication circuit 2400 may communicate with an external device of the computing system 2000 according to a control of the processor 2100. The communication circuit 2400 may communicate with the external device by using a wire or wireless communication protocol. For instance, the communication circuit 2400 may communicate based on at least one of wireless communication protocols such as LTE (Long Term Evolution), WiMax, GSM (Global System for Mobile communication), CDMA (Code Division Multiple Access), Bluetooth, NFC (Near Field Communication), WiFi, RFID (Radio Frequency Identification), etc. and wire communication protocols such as USB (Universal Serial Bus), SATA (Serial AT Attachment), SCSI (Small Computer Small Interface), Firewire, PCI (Peripheral Component Interconnection), etc.

The user interface 2500 may interface communications between a user and the computing system 2000 according to a control of the processor 3100. In exemplary embodiments, the user interface 2500 may include input interfaces such as a keyboard, a keypad, a button, a touch panel, a touch screen, a touch pad, a touch ball, a camera, a microphone, a gyroscope sensor, a vibration sensor, etc. Furthermore, the user interface 2500 may include output interfaces such as an LCD (Liquid Crystal Display), an OLED (Organic Light Emitting Diode) display device, an AMOLED (Active Matrix OLED) display device, an LED, a speaker, a motor, etc.

A device component shown in each block diagram may be to help understanding of the inventive concepts. Each block may be formed of smaller blocks according to a function. Also, a plurality of blocks may form a large circuit of block according to a function. That is, the inventive concepts may not be limited to components shown in a block diagram.

While the present disclosure has been described with reference to exemplary embodiments, it will be apparent to those skilled in the art that various changes and modifications may be made without departing from the spirit and scope of the disclosure as defined by the following claims.

What is claimed is:

1. A semiconductor memory device comprising:
a termination resistance calibration circuit configured to calibrate a first termination resistance of a data output driver of the semiconductor memory device, wherein the termination resistance calibration circuit comprises:
a first self-adjustment logic configured to determine whether a value of an upper bit string of a first calibration code is equal to or greater than a first upper critical value with respect to the first calibration code, or is equal to or less than a first lower critical value with respect to the first calibration code, in response to a first calibration start signal, and to generate a first adjustment signal for adjusting a value of the first termination resistance of the data output driver based on the determination result of the first self-adjustment logic, wherein the first lower critical value is less than the first upper critical value; and
a first resistance calibration logic configured to provide the upper bit string of the first calibration code to the first self-adjustment logic, and to generate a first updated calibration code by performing a first calibration calculation based on the first calibration code and a first comparison signal generated according to a result of comparing a reference voltage and a voltage of a first comparison target node,
wherein the first updated calibration code calibrates the first termination resistance of the data output driver, after the value of the first termination resistance of the data output driver is adjusted by the first adjustment signal.

2. The semiconductor memory device of claim 1, wherein the value of the first termination resistance of the data output driver is adjusted in an increasing direction or in a decreasing direction, and
wherein the adjusted direction of the value of the first termination resistance of the data output driver when the value of the upper bit string of the first calibration code is equal to or greater than the first upper critical value is different from that when the value of the upper bit string of the first calibration code is equal to or less than the first lower critical value.

3. The semiconductor memory device of claim 1, wherein the first self-adjustment logic is further configured to generate a bit position signal including position information of a bit of the first calibration code based on the determination result of the first self-adjustment logic, and
wherein the first calibration calculation is performed based on the first calibration code, the first comparison signal, and the bit position signal.

4. The semiconductor memory device of claim 3, wherein the bit position signal comprises position information of one of the bits included in the upper bit string of the first calibration code when the value of the upper bit string of the first calibration code is equal to or greater than the first upper critical value, or is equal to or less than the first lower critical value, and
wherein the bit position signal comprises position information of one of the remaining bits of the first calibration code other than the upper bit string of the first calibration code when the value of the upper bit string of the first calibration code is less than the first upper critical value and greater than the first lower critical value.

5. The semiconductor memory device of claim 3, wherein the first resistance calibration logic is configured to perform the first calibration calculation by adding a calculation bit string, of which only one bit has a logical value of 1 or 0, to the first calibration code or by subtracting the calculation bit string from the first calibration code,
wherein one of the addition and the subtraction is performed based on the first comparison signal,
wherein a position of the only one bit, having a logical value of 1 or 0, of the calculation bit string is shifted by one or more bits in lower bit direction from a position of a bit corresponding to the bit position signal, at each time when the addition or the subtraction is performed, and
wherein the addition or the subtraction is iteratively performed until a least significant bit of the calculation bit string becomes the only one bit having a logical value of 1 or 0.

6. The semiconductor memory device of claim 5, wherein the first updated calibration code corresponds to the first calibration code when performing the addition or the subtraction is ended.

7. The semiconductor memory device of claim 1, wherein the termination resistance calibration circuit further comprises:
- a second self-adjustment logic configured to determine whether a value of an upper bit string of a second calibration code is equal to or greater than a second upper critical value with respect to the second calibration code, or is equal to or less than a second lower critical value with respect to the second calibration code, in response to a second calibration start signal, and to generate a second adjustment signal for adjusting a value of a second termination resistance of the data output driver based on the determination result of the second self-adjustment logic; and
- a second resistance calibration logic configured to provide the upper bit string of the second calibration code to the second self-adjustment logic, and to generate a second updated calibration code by performing a second calibration calculation based on the second calibration code and a second comparison signal generated according to a result of comparing the reference voltage and a voltage of a second comparison target node,
- wherein the second updated calibration code calibrates the second termination resistance of the data output driver, after the value of the second termination resistance of the data output driver is adjusted by the second adjustment signal.

8. The semiconductor memory device of claim 7, wherein the data output driver comprises:
- a first pull-up driver connected to be controlled by the first adjustment signal;
- a second pull-up driver connected to be controlled by the first updated calibration code;
- a first pull-down driver connected to be controlled by the second adjustment signal; and
- a second pull-down driver connected to be controlled by the second updated calibration code.

9. The semiconductor memory device of claim 7, wherein the first calibration start signal is received from an outside of the semiconductor memory device, and the second calibration start signal is generated after the first updated calibration code is generated.

10. A method for calibrating a termination resistance of a semiconductor memory device, the method comprising:
- loading a calibration code in response to a calibration start signal;
- determining whether a value of an upper bit string of the calibration code is equal to or greater than an upper critical value, or equal to or less than a lower critical value, wherein the lower critical value is less than the upper critical value;
- adjusting a value of a termination resistance of a data output driver when the value of the upper bit string of the calibration code is equal to or greater than the upper critical value, or equal to or less than the lower critical value;
- generating an updated calibration code by performing a calibration calculation based on the calibration code and a comparison signal generated according to a result of comparing a reference voltage and a voltage of a comparison target node; and
- calibrating the termination resistance of the data output driver based on the adjusted value and the updated calibration code.

11. The method of claim 10, wherein the value of the termination resistance of the data output driver is adjusted by an adjustment signal in an increasing direction or in a decreasing direction, and
- wherein the adjusted direction of the value of the termination resistance of the data output driver when the value of the upper bit string of the calibration code is equal to or greater than the upper critical value is different from that when the value of the upper bit string of the calibration code is equal to or less than the lower critical value.

12. The method of claim 10, further comprising:
- generating a bit position signal including position information of one bit of the calibration code when the calibration calculation is started, based on the determination result, and
- wherein the calibration calculation is performed based on the calibration code, the comparison signal, and the bit position signal.

13. The method of claim 12, wherein the bit position signal comprises position information of one of the bits included in the upper bit string of the calibration code when the value of the upper bit string of the calibration code is equal to or greater than the upper critical value, or is equal to or less than the lower critical value, and
- wherein the bit position signal comprises position information of one of the remaining bits of the calibration code other than the upper bit string of the calibration code when the value of the upper bit string of the calibration code is less than the upper critical value and greater than the lower critical value.

14. The method of claim 12, wherein the calibration calculation is performed by adding a calculation bit string, of which only one bit has a logical value of 1 or 0, to the calibration code or by subtracting the calculation bit string from the calibration code,
- wherein one of the addition and the subtraction is performed based on the comparison signal,
- wherein a position of the only one bit, having a logical value of 1 or 0, of the calculation bit string is shifted by one or more bits in lower bit direction from a position of a bit corresponding to the bit position signal, at each time when the addition or the subtraction is performed, and
- wherein the addition or the subtraction is iteratively performed until a least significant bit of the calculation bit string becomes the only one bit having a logical value of 1 or 0.

15. The method of claim 14, wherein the updated calibration code corresponds to the calibration code when performing the addition or the subtraction is ended.

16. A method of calibrating a termination resistance of a data output driver of a semiconductor memory device, the method comprising:
- performing a first calibration of a first termination resistance of the semiconductor memory device to generate a first calibration code;
- performing a first adjustment of the first termination resistance based on the first calibration code in response to a first calibration start signal to generate a first adjustment code for adjusting a value of the first termination resistance; and
- performing a second calibration of the first termination resistance in response to the first adjustment code to generate a first updated calibration code corresponding to a first target termination resistance, wherein the first adjustment code and the first updated calibration code control either a pull-up driver of the data output driver or a pull-down driver of the data output driver.

17. The method of claim 16, further comprising:

performing a third calibration of a second termination resistance of the semiconductor memory device to generate a second calibration code;

performing a second adjustment of the second termination resistance based on the second calibration code in response to a second calibration start signal generated when the performing the second calibration is finished to generate a second adjustment code for adjusting a value of the second termination resistance; and performing a fourth calibration of the second termination resistance in response to the second adjustment code to generate a second updated calibration code corresponding a second target termination resistance, wherein the second adjustment code and the second updated calibration code control the pull-up driver when the first adjustment code and the first updated calibration code control the pull-down driver, and the second adjustment code and the second updated calibration code control the pull-down driver when the first adjustment code and the first updated calibration code control the pull-up driver.

18. The method of claim 16, wherein the first termination resistance decreases if a value of at least a first most significant bit of the first calibration code is equal to a value of a first reference calibration code, and wherein the first termination resistance increases if the value of at least the first most significant bit of the first calibration code is equal to a value of a second reference calibration code less than the value of the first reference calibration code.

19. The method of claim 18, wherein the first most significant bit includes at least two bits.

20. The method of claim 18, wherein each of the first and second adjustment codes includes one or two bits.

* * * * *